(12) United States Patent
Kang et al.

(10) Patent No.: US 11,889,008 B2
(45) Date of Patent: Jan. 30, 2024

(54) ELECTRONIC DEVICE INCLUDING ELASTIC MEMBER

(71) Applicant: Samsung Electronics Co., Ltd., Suwon-si (KR)

(72) Inventors: Jongmin Kang, Suwon-si (KR); Yunsik Kim, Suwon-si (KR); Jungwon Park, Suwon-si (KR); Seungchul Baek, Suwon-si (KR); Suman Lee, Suwon-si (KR); Chijoon Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/503,896

(22) Filed: Oct. 18, 2021

(65) Prior Publication Data

US 2022/0038563 A1 Feb. 3, 2022

Related U.S. Application Data

(63) Continuation of application No. 16/838,487, filed on Apr. 2, 2020, now Pat. No. 11,153,421.

(30) Foreign Application Priority Data

May 3, 2019 (KR) .................. 10-2019-0052095

(51) Int. Cl.
*H04M 1/02* (2006.01)
*G06F 1/16* (2006.01)
(Continued)

(52) U.S. Cl.
CPC ........ *H04M 1/0216* (2013.01); *G06F 1/1616* (2013.01); *G06F 1/1652* (2013.01);
(Continued)

(58) Field of Classification Search
CPC ............ H04M 1/0216; H04M 1/0268; H04M 1/0277; H04M 2201/38; G06F 1/1616;
(Continued)

(56) References Cited

U.S. PATENT DOCUMENTS 10,019,038 B2   7/2018   Garelli et al.
10,231,347 B2   3/2019   Seo et al.
(Continued)

FOREIGN PATENT DOCUMENTS

| CN | 106486018 A | 3/2017 |
|---|---|---|
| EP | 3 451 115 A | 3/2019 |
| KR | 10-2005-0039419 A | 4/2005 |

OTHER PUBLICATIONS

Extended European Search Report dated Aug. 20, 2020, issued in European Office Application No. 20169603.6.
(Continued)

*Primary Examiner* — Junpeng Chen
(74) *Attorney, Agent, or Firm* — Jefferson IP Law, LLP

(57) ABSTRACT

An electronic device is provided. The electronic device includes a first housing structure including a first surface facing in a first direction, a second surface facing in a second direction opposite to the first direction, and a first side surface member at least partially surrounding a space between the first surface and the second surface, a second housing structure including a third surface facing in a third direction, a fourth surface facing in a fourth direction opposite to the third direction, and a second side surface member at least partially surrounding a space between the third surface and the fourth surface, a hinge structure rotatably connecting the first housing structure and the second housing structure, the hinge structure providing a folding axis on which the first housing structure and the second housing structure rotate, the hinge structure including a first hinge plate mounted inside the first housing structure and a
(Continued)

second hinge plate mounted inside the second housing structure, at least one flexible printed circuit board crossing the first hinge plate and the second hinge plate and extending from an inside of the first housing structure to an inside of the second housing structure, and at least one elastic member disposed on at least one of the first hinge plate and the second hinge plate in a position adjacent to the folding axis. The elastic member is, at least one of, disposed between at least one of the first hinge plate or the flexible printed circuit board or disposed between the second hinge plate and the flexible printed circuit board.

15 Claims, 15 Drawing Sheets

(51) Int. Cl.
    *H05K 1/02*         (2006.01)
    *H05K 1/18*         (2006.01)

(52) U.S. Cl.
    CPC ........ *G06F 1/1681* (2013.01); *H04M 1/0268* (2013.01); *H04M 1/0277* (2013.01); *H05K 1/028* (2013.01); *H05K 1/189* (2013.01); *H04M 2201/38* (2013.01)

(58) Field of Classification Search
    CPC ..... G06F 1/1652; G06F 1/1681; H05K 1/028; H05K 1/189
    See application file for complete search history.

(56) References Cited

U.S. PATENT DOCUMENTS

| | | | |
|---|---|---|---|
| 10,345,858 | B2 | 7/2019 | Han et al. |
| 10,469,635 | B1 | 11/2019 | Carlson et al. |
| 10,551,880 | B1 | 2/2020 | Ai et al. |
| 10,754,395 | B2 * | 8/2020 | Sanchez ............... H05K 5/0086 |
| 10,860,056 | B2 * | 12/2020 | Watamura ............. G06F 1/1643 |
| 10,955,880 | B2 * | 3/2021 | Wang .................. H04M 1/0268 |
| 10,959,341 | B2 | 3/2021 | Choi et al. |
| 2006/0279942 | A1 | 12/2006 | Yasuda |
| 2012/0264489 | A1 | 10/2012 | Choi et al. |
| 2015/0233162 | A1 | 8/2015 | Lee et al. |
| 2017/0013729 | A1 | 1/2017 | Rothkopf et al. |
| 2017/0061836 | A1 | 3/2017 | Kim et al. |
| 2017/0068275 | A1 | 3/2017 | Lee et al. |
| 2017/0142847 | A1 | 5/2017 | Park |
| 2017/0145724 | A1 | 5/2017 | Siddiqui |
| 2017/0220072 | A1 | 8/2017 | Chen |
| 2017/0357473 | A1 | 12/2017 | Kim |
| 2017/0364123 | A1 | 12/2017 | Seo et al. |
| 2018/0049329 | A1 * | 2/2018 | Seo .......................... E05D 3/18 |
| 2018/0095502 | A1 | 4/2018 | Yamazaki et al. |
| 2018/0275725 | A1 | 9/2018 | Lin et al. |
| 2018/0324964 | A1 * | 11/2018 | Yoo ...................... H05K 5/0017 |
| 2019/0018457 | A1 | 1/2019 | Kim et al. |
| 2019/0025887 | A1 | 1/2019 | Seo et al. |
| 2019/0033920 | A1 | 1/2019 | Yun et al. |
| 2020/0236203 | A1 * | 7/2020 | Carlson ............... H04M 1/0216 |
| 2020/0323089 | A1 | 10/2020 | Rothkopf et al. |

OTHER PUBLICATIONS

International Search Report and written opinion dated Jul. 8, 2020, issued in International Application No. PCT/KR2020/004577.
Extended European Search Report dated Sep. 19, 2022, issued in European Patent Application No. 22175449.2.
Extended European Search Report dated May 10, 2023, issued in a European Patent Application No. 23166223.0.
Chinese Decision to Grant dated Oct. 20, 2023, issued in Chinese Application No. 202080032886.1.
Indian Examination Report dated Nov. 13, 2023, issued in Indian Application No. 202117034560.

* cited by examiner

ELECTRONIC DEVICE INCLUDING ELASTIC MEMBER

CROSS-REFERENCE TO RELATED APPLICATION(S)

This application is a continuation application of prior application Ser. No. 16/838,487, filed on Apr. 2, 2020, which is based on and claims priority under 35 U.S.C § 19(a) of a Korean patent application number 10-2019-0052095, filed on May 3, 2019, in the Korean Intellectual Property Office, the disclosure of which is incorporated by reference herein in its entirety.

BACKGROUND

1. Field

The disclosure relates to an electronic device. More particularly, the disclosure relates to an electronic device with an elastic member.

2. Description of Related Art

Developing electronic information communication technology integrates various functionalities into a single electronic device. For example, smartphones pack the functionalities of a sound player, imaging device, and scheduler, as well as the communication functionality and, on top of that, may implement more various functions by having applications installed thereon.

The user of an electronic device may search, screen, and obtain more information by accessing a network, rather than simply using the functionalities or information (e.g., applications) of the electronic device. Direct access to the network (e.g., wired communication) may enable quick and stable communication establishment but its usability may be limited to a fixed location or space. Wireless network access is less limited in location or space, delivers a level of speed and stability approaching that of direct network access, and is expected to be able to establish communication faster and more stably than direct network access.

Personal/portable electronic devices such as smartphones spread, user demand for portability and use convenience is on the rise. For example, a touchscreen display may not only serve as an output device of visual information but also provide a virtual keyboard that replaces a physical input device (e.g., a keypad). As such, electronic devices may be made compact while delivering further enhanced applicability (e.g., a larger screen). Flexible displays, e.g., foldable or rollable displays, will become commercially available and electronic devices are expected to deliver better portability and use convenience.

When an electronic device or display folds or rolls, or unfolds (hereinafter, "transforms"), a relative displacement may occur between adjacent structures or electronic components in the electronic device. In an embodiment, the electronic device may include a flexible printed circuit board electrically connecting the internal electronic components. The flexible printed circuit board may transform, corresponding to the transforming of the electronic device, and may contact or rub against another adjacent structure or electronic component. The contact or friction between the internal structures or electronic components while the electronic device transforms may cause a noise. In some embodiments, such contact or friction may wear the internal structures or electronic components. Such electronic components as the flexible printed circuit board may be worn and resultantly lose their functions.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device capable of mitigating or preventing contact (or friction) between electronic components while transforming.

Another aspect of the disclosure is to provide an electronic device capable of suppressing wear or damage due to contact or friction between the structures or electronic components while transforming.

Additional aspects will be set forth in part in the description which follows and, in part, will be apparent from the description, or may be learned by practice of the presented embodiments.

In accordance with an aspect of the disclosure, an electronic device is provided. The electronic device includes a first housing structure including a first surface facing in a first direction, a second surface facing in a second direction opposite to the first direction, and a first side surface member at least partially surrounding a space between the first surface and the second surface, a second housing structure including a third surface facing in a third direction, a fourth surface facing in a fourth direction opposite to the third direction, and a second side surface member at least partially surrounding a space between the third surface and the fourth surface, a hinge structure rotatably connecting the first housing structure and the second housing structure, the hinge structure providing a folding axis on which the first housing structure and the second housing structure rotate, the hinge structure including a first hinge plate mounted inside the first housing structure and a second hinge plate mounted inside the second housing structure, at least one flexible printed circuit board crossing the first hinge plate and the second hinge plate and extending from an inside of the first housing structure to an inside of the second housing structure, and at least one elastic member disposed on at least one of the first hinge plate or the second hinge plate in a position adjacent to the folding axis, wherein the elastic member is, at least one of, disposed between the first hinge plate and the at least one flexible printed circuit board, or between the second hinge plate and the flexible printed circuit board.

In accordance with another aspect of the disclosure, an electronic device is provided. The electronic device includes a first housing structure, a second housing structure, a hinge structure rotatably connecting the first housing structure and the second housing structure, the hinge structure including a first hinge plate mounted inside the first housing structure, and a second hinge plate mounted inside the second housing structure, at least one flexible printed circuit board crossing the first hinge plate and the second hinge plate, the at least one flexible printed circuit board extending from an inside of the first housing structure to an inside of the second housing structure, and a plurality of elastic members individually disposed on the first hinge plate and the second hinge plate, the plurality of elastic members partially facing the flexible printed circuit board, wherein the plurality of elastic members include an attaching area formed on a surface facing the first hinge plate or the second hinge plate and a non-attaching area formed to abut at least two opposite sides of the attaching area on the surface facing the first hinge plate or the second hinge plate.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
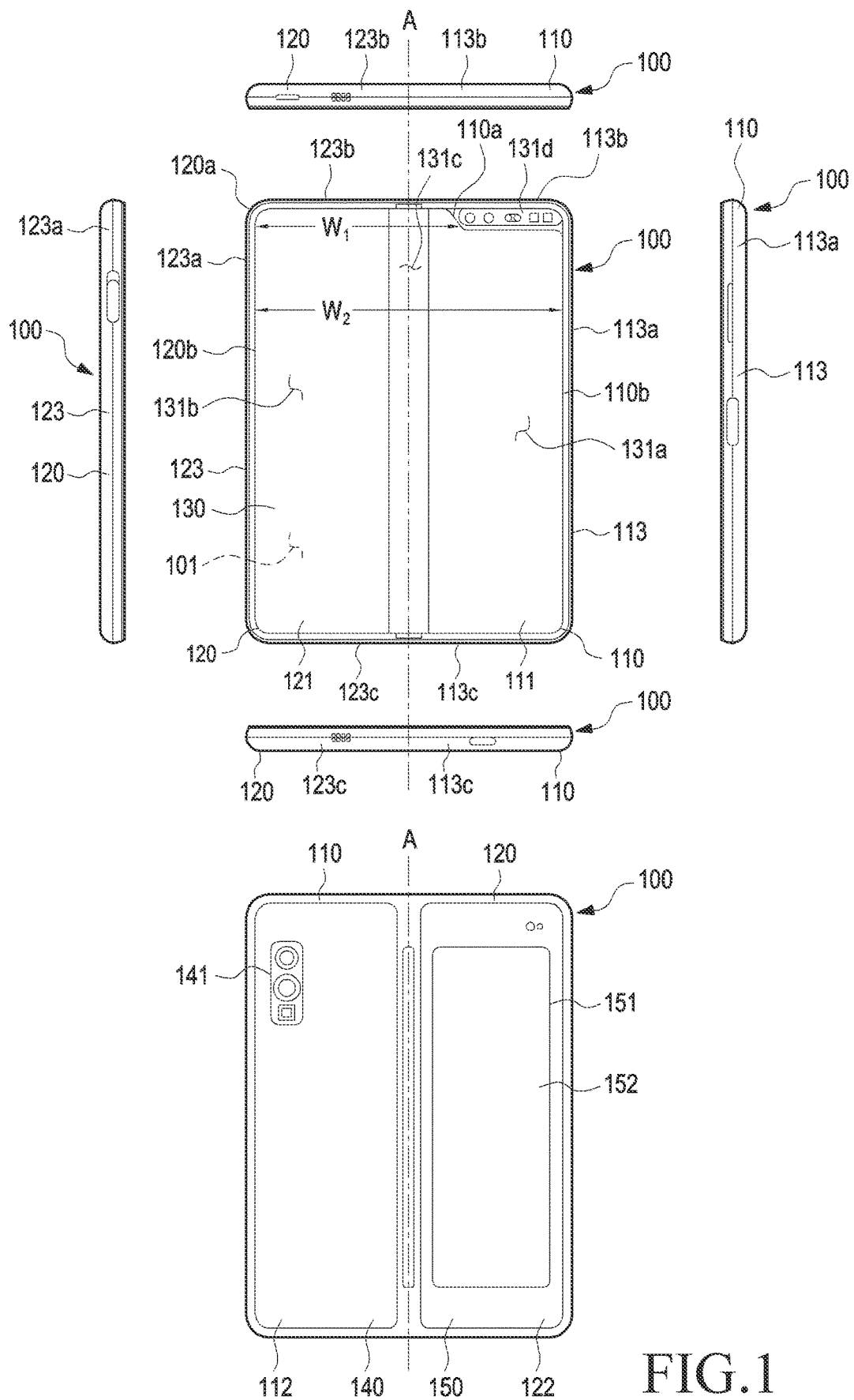
FIG. 1 is a view illustrating an unfolded state of an electronic device according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program) including one or more instructions that are stored in a storage medium (e.g., internal memory or external memory) that is readable by a machine (e.g., the electronic device). For example, a processor (e.g., the processor) of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

FIG. 1 is a view illustrating an unfolded state of an electronic device 100 according to an embodiment of the disclosure.

Figure 2:
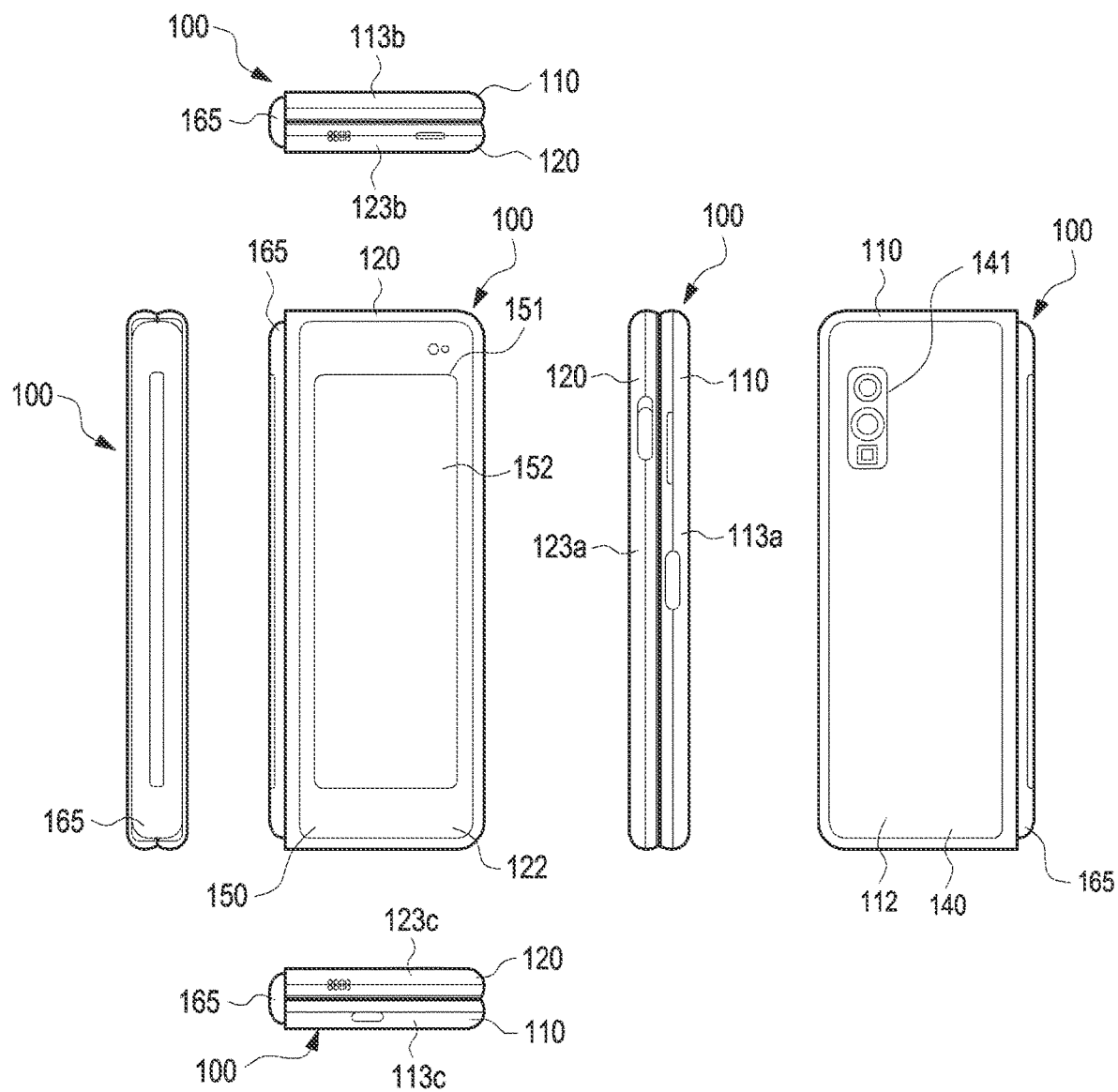
FIG. 2 is a view illustrating a folded state of an electronic device as shown in FIG. 1, according to an embodiment of the disclosure.

FIG. 2 is a view illustrating a folded state of the electronic device 100 of FIG. 1, according to an embodiment of the disclosure.

In the following description, a pair of housing structures is rotatably coupled together via a hinge structure, for example. However, it should be noted that the electronic device according to various embodiments of the disclosure is not limited thereto. For example, according to various embodiments, the electronic device may include three or more housing structures. As used herein, a "pair of housing structures" may mean two rotatably-coupled housing structures among three or more housing structures.

Referring to FIG. 1, an electronic device 100 may include a pair of housing structures 110 and 120 coupled together via a hinge structure (e.g., the hinge structure 164 of FIG. 3) to be rotatable to fold to each other, a hinge cover 165 covering foldable portions of the pair of housing structures 110 and 120, and a display 130 (e.g., a flexible display or foldable display) disposed in a space formed by the pair of housing structures 110 and 120. According to an embodiment, the electronic device 100 may include a foldable housing rotatably coupled from the position in which the pair of housing structures 110 and 120 is folded together to the position in which the pair of housing structures 110 and 120 is unfolded flat. In the disclosure, the surface where the display 130 is in may be defined as a 'front surface' of the electronic device 100, and its opposite surface may be defined as a 'back surface' of the electronic device 100. The surface surrounding the space between the front and back surfaces may be defined as a 'side surface' of the electronic device 100.

According to an embodiment, the pair of housing structures 110 and 120 may include a first housing structure 110, a second housing structure 120, a first back cover 140, and a second back cover 150. The pair of housing structures 110 and 120 of the electronic device 100 is not limited to the shape and coupling shown in FIGS. 1 and 2 but may rather be implemented in other shapes or via a combination and/or coupling of other components. For example, the first housing structure 110 and the first back cover 140 may be integrally formed with each other, and the second housing structure 120 and the second back cover 150 may be integrally formed with each other. According to an embodiment, the first housing structure 110 may include the first back cover 140, and the second housing structure 120 may include the second back cover 150.

According to an embodiment, the first housing structure 110 and the second housing structure 120 may be positioned on opposite sides of a first axis, e.g., a folding axis A, and they may be overall symmetrical in shape with each other with respect to the folding axis A. According to an embodiment, the first housing structure 110 and the second housing structure 120 may be rotated on the hinge structure 164 or hinge cover 165 with respect to different folding axes. For example, the first housing structure 110 and the second housing structure 120 each may be rotatably coupled to the hinge structure 164 or the hinge cover 165, and the first housing structure 110 and the second housing structure 120 may be rotated on the folding axis A or different folding axes from the position where they are folded together to the position where they are inclined or unfolded side-by-side with respect to each other.

As used herein, when A and B are positioned or extend side-by-side, it may mean that A and B are positioned at least partially next to each other or at least partially in parallel with each other. According to an embodiment, when A and B are disposed (or arranged) side-by-side, it may mean that A and B are disposed (or arranged) to face in the same direction or directions parallel with each other. In the following description, although the example phrases "side-by-side" and "in parallel with each other" may be used to describe the corresponding structures, the shape or arrangement of the structures may easily be appreciated from the accompanying drawings.

According to an embodiment, the first housing structure 110 and the second housing structure 120 may form different angles or distances depending on whether they are in an unfolded state (or, extended state, flat, state, or open state) or folded state (or folding state), or in a state therebetween. According to an embodiment, the first housing structure 110 and the second housing structure 120 may be symmetrical in shape except that the first housing structure 110 further includes a sensor area 131d where various sensors are arranged. Alternatively, the sensor area 131d may be disposed in the second housing structure 120, not the first housing structure 110, or another sensor area may be included in the second housing structure 120.

According to an embodiment, in the unfolded state of the electronic device 100, the first housing structure 110 may be connected to the hinge structure (e.g., the hinge structure 164 of FIG. 3) and may include a first surface 111 disposed to face the front surface of the electronic device 100, a second surface 112 facing away from the first surface 111, and a first side surface member 113 surrounding at least a portion of the space between the first surface 111 and the second surface 112. According to an embodiment, the first side surface member 113 may include a first side surface 113a disposed in parallel with the folding axis A, a second side surface 113b extending from one end of the first side surface 113a in a direction perpendicular to the folding axis A, and a third side surface 113c extending from the other end of the first side surface 113a in a direction perpendicular to the folding axis A. As used herein, the term "perpendicular" or "parallel" may be interchangeably used with "partially perpendicular" or "partially parallel." In some embodiments, "parallel" or "perpendicular" may also mean "inclined in an angle range within 10 degrees."

According to an embodiment, the second housing structure 120 may be connected to the hinge structure (e.g., the hinge structure 164 of FIG. 3) and, in the unfolded state of the electronic device 100, the second housing structure 120 may include a third surface 121 disposed to face the front surface of the electronic device 100, a fourth surface 122 facing away from the third surface 121, and a second side surface member 123 surrounding at least a portion of the space between the third surface 121 and the fourth surface 122. According to an embodiment, the second side surface member 123 may include a fourth side surface 123a disposed in parallel with the folding axis A, a fifth side surface 123b extending from one end of the fourth side surface 123a in a direction perpendicular to the folding axis A, and a sixth side surface 123c extending from the other end of the fourth side surface 123a in a direction perpendicular to the folding axis A. According to an embodiment, the third surface 121, in the folded state, may be disposed to face the first surface 111. According to an embodiment, the second side surface member 123 may be formed in substantially the same shape or material as the first side surface member 113 although they may partially differ in their specific shapes.

According to an embodiment, the electronic device 100 may include a recess 101 to receive the display 130 via a structural shape combination of the first housing structure 110 and the second housing structure 120. The recess 101 may have substantially the same size as the display 130. According to an embodiment, due to the sensor area 131d, the recess 101 may have two or more different widths in the direction perpendicular to the folding axis A. For example, the recess 101 may have a first width W1 between a first portion 120a, parallel with the folding axis A, of the second housing structure 120, and a first portion 110a, formed at an edge of the sensor area 131d, of the first housing structure 110 and a second width W2 formed by a second portion 120b of the second housing structure 120 and a second portion 110b, which is parallel with the folding axis A and does not correspond to the sensor area 131d, of the first housing structure 110. In this case, the second width W2 may be larger than the first width W1. For example, the recess 101 may be formed with the first width W1 between the first portion 110a of the first housing structure 110 and the first portion 120a of the second housing structure 120, which are asymmetrical in shape with each other, and the second width W1 between the second portion 110b of the first housing structure 110 and the second portion 120b of the second housing structure 120, which are symmetrical in shape with each other. According to an embodiment, the first portion 110a and second portion 110b of the first housing structure 110 may be formed to have different distances from the folding axis A. The width of the recess 101 is not limited thereto. According to an embodiment, the recess 101 may have two or more different widths depending on the shape of the sensor area 131d or the asymmetrical shape portions of the first housing structure 110 and the second housing structure 120.

According to an embodiment, the first housing structure 110 and the second housing structure 120 may at least partially be formed of a metal or non-metallic material with a rigidity selected to support the display 130. According to an embodiment, the first housing structure 110 and the second housing structure 120 may at least partially include an electrically conductive material. When the first housing structure 110 and the second housing structure 120 include an electrically conductive material, the electronic device 100 may transmit/receive radio waves via the electrically conductive portions of the first housing structure 110 and the second housing structure 120. For example, the processor or communication module of the electronic device may perform wireless communication using a portion of the first housing structure 110 and the second housing structure 120.

According to an embodiment, the sensor area 131d may be formed adjacent to one corner of the first housing structure 110 and to have a predetermined area. However, the placement, shape, or size of the sensor area 131d is not limited to that shown in the drawings. For example, according to an embodiment, the sensor area 131d may be provided in a different corner of the first housing structure 110 or in any area between the top corner and the bottom corner. According to an embodiment, the sensor area 131d may be disposed in at least an area of the second housing structure 120. According to an embodiment, the sensor area 131d may be disposed to extend to the first housing structure 110 and the second housing structure 120. According to an embodiment, the electronic device 100 may include components exposed from its front surface through the sensor area 131d or one or more openings prepared in the sensor area 131d and may perform various functions by way of the components. The components arranged in the sensor area 131d may include at least one of, e.g., a front camera device, a proximity sensor, an illuminance sensor, an iris recognition sensor, an ultrasonic sensor, or an indicator.

According to an embodiment, the first back cover 140 may be disposed on the second surface 112 of the first housing structure 110 and may have a substantially rectangular periphery. According to an embodiment, the periphery of the first back cover 140 may be at least partially surrounded by the first housing structure 110. Similarly, the second back cover 150 may be disposed on the fourth surface 122 of the second housing structure 120 and its periphery may be at least partially surrounded by the second housing structure 120.

In the shown embodiment, the first back cover 140 and the second back cover 150 may be substantially symmetrical in shape with respect to the folding axis A. According to an embodiment, the first back cover 140 and the second back cover 150 may have other various different shapes. According to an embodiment, the first back cover 140 may be integrally formed with the first housing structure 110, and the second back cover 150 may be integrally formed with the second housing structure 120.

According to an embodiment, a combined structure of the first back cover 140, the second back cover 150, the first housing structure 110, and the second housing structure 120 may provide a space where various components (e.g., a printed circuit board, antenna module, sensor module, or battery) of the electronic device 100 may be arranged. According to an embodiment, one or more components may be arranged or visually exposed on/through the back surface of the electronic device 100. For example, one or more components or sensors may be visually exposed through a first back surface area 141 of the first back cover 140. According to an embodiment, the sensor may include a proximity sensor, a rear camera device, and/or flash. According to an embodiment, a sub display 152 may be at least visually exposed through a second back surface area 151 of the second back cover 150.

The display 130 may be disposed in a space formed by the pair of housing structures 110 and 120. For example, the display 130 may be seated in a recess (e.g., the recess 101 of FIG. 1) formed by the pair of housing structures 110 and 120, and the display 130 may be disposed to occupy substantially most of the front surface of the electronic device 100. For example, the front surface of the electronic device 100 may include the display 130, a partial area (e.g., an edge area) of the first housing structure 110, which is adjacent to the display 130, and a partial area (e.g., an edge area) of the second housing structure 120. According to an embodiment, the back surface of the electronic device 100 may include the first back cover 140, a partial area (e.g., an edge area) of the first housing structure 110, which is adjacent to the first back cover 140, the second back cover 150, and a partial area (e.g., an edge area) of the second housing structure 120, which is adjacent to the second back cover 150.

According to an embodiment, the display 130 may mean a display at least a portion of which may be transformed to be flat or curved. According to an embodiment, the display 130 may include a folding area 131c, a first area 131a disposed on one side of the folding portion 131c (e.g., a right-hand area of the folding portion 131c), and a second area 131b disposed on the opposite side of the folding portion 131c (e.g., a left-hand area of the folding portion 131c). For example, the first area 131a may be disposed on the first surface 111 of the first housing structure 110, and the second area 131b may be disposed on the third surface 121 of the second housing structure 120. For example, the display 130 may extend from the first surface 111 through the hinge structure 164 of FIG. 3 to the third surface 121, and its area (e.g., the folding area 131c) corresponding to, at least, the hinge structure may be a flexible area that may transform from flat to curved.

According to an embodiment, the segmentation of the display 130 is merely an example, and the display 130 may be divided into a plurality of (e.g., four or more or two) areas depending on the structure or function of the display 130. As an example, in the embodiment shown in FIG. 1, the folding area 131c may extend in the vertical axis (e.g., the y axis of FIG. 3) parallel with the folding axis A, and the area of the display 130 may be divided by the folding area 131c or the folding axis A. In another embodiment, the area of the display 130 may be divided by another folding portion (e.g., a folding area parallel with the horizontal axis (e.g., the x axis of FIG. 3) or another folding axis (e.g., a folding axis parallel with the x axis of FIG. 3). The above-described area segmentation is merely physical segmentation by the pair of housing structures 110 and 120 and hinge structure (e.g., the hinge structure 164 of FIG. 3) and, substantially, the display 130 may display a single whole screen via the pair of housing structures 110 and 120 and the hinge structure (e.g., the hinge structure 164 of FIG. 3).

According to an embodiment, the first area 131a and the second area 131b may be overall symmetrical in shape with respect to the folding area 131c. However, unlike the second area 131b, the first area 131a may include a notch area (e.g., the notch area 133 of FIG. 3) that provides the sensor area 131d and, in the remaining area, be symmetrical in shape with the second area 131b. For example, the first area 131a and the second area 131b may include symmetrical portions and asymmetrical portions.

Figure 3:
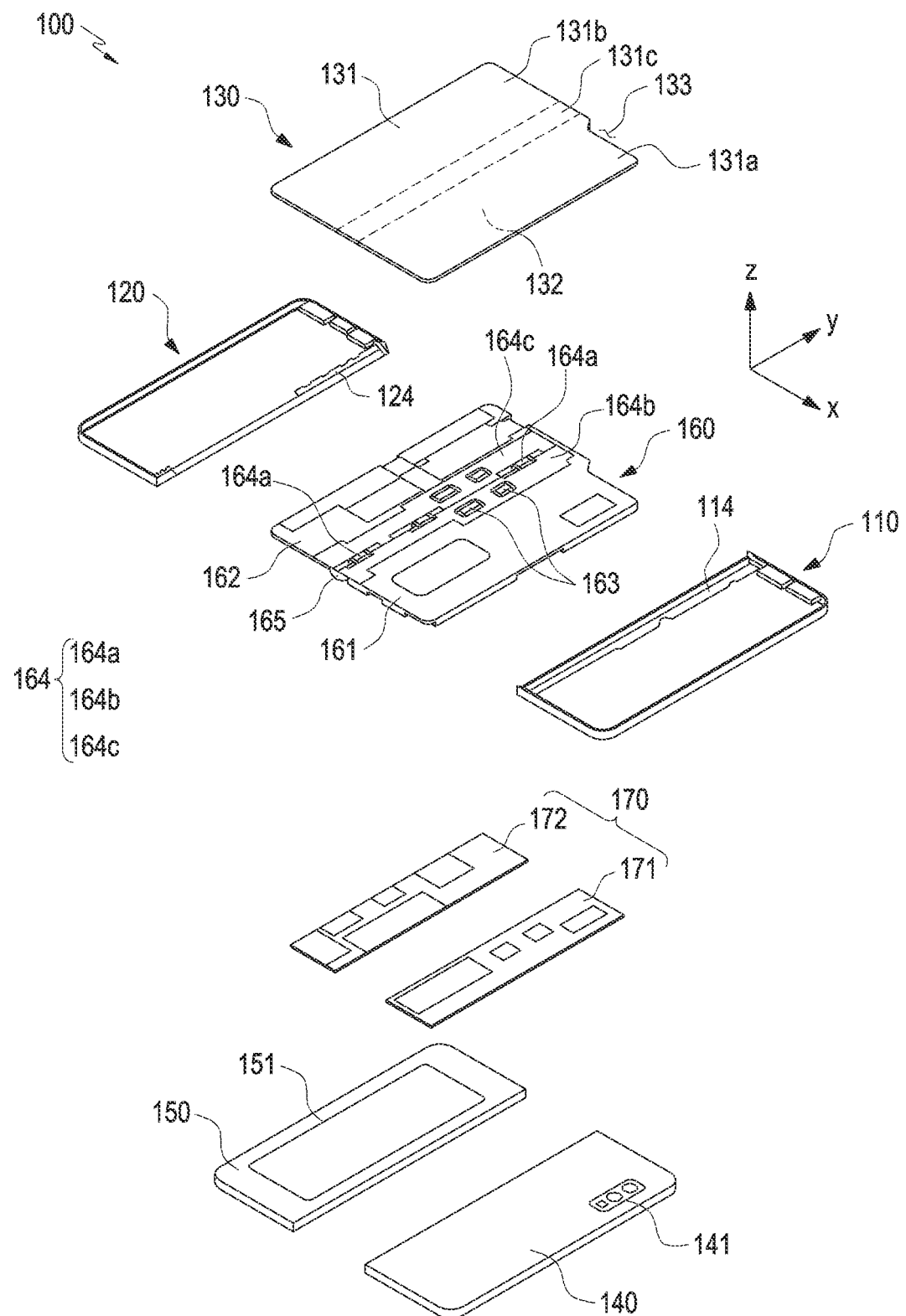
FIG. 3 is an exploded perspective view illustrating an electronic device according to an embodiment of the disclosure.

Referring to FIG. 3, the hinge cover 165 may be disposed between the first housing structure 110 and the second housing structure 120 to hide the internal components (e.g., the hinge structure 164 of FIG. 3). According to an embodiment, the hinge cover 165 may be hidden by a portion of the first housing structure 110 and second housing structure 120 or be exposed to the outside depending on the operation state (e.g., the unfolded state or folded state) of the electronic device 100.

Described below are the operation of the first housing structure 110 and the second housing structure 120 and each area of the display 130 depending on the operation state (e.g., the unfolded state and folded state) of the electronic device.

According to an embodiment, when the electronic device 100 is in the unfolded state (e.g., the state as shown in FIG. 1), the first housing structure 110 and the second housing structure 120 are 180-degree angled therebetween, and the first area 131a and second area 131b of the display 130 may be placed to display screen in the same direction, e.g., in directions parallel with each other. The folding area 131c may be flush with the first area 131a and the second area 131b.

Referring to FIG. 2, according to an embodiment, when the electronic device is in the folded state (e.g., the state as shown in FIG. 2), the first housing structure 110 and the second housing structure 120 may face each other. For example, in the folded state (e.g., the state as shown in FIG. 2) of the electronic device 100, the first area 131a and the second area 131b of the display 130 may be rendered to face each other, angled at a small angle (e.g., from 0 degrees to 10 degrees) therebetween. In the folded state (e.g., the state as shown in FIG. 2) of the electronic device 100, the folding area 131c may at least partially form a curved surface with a predetermined curvature.

According to an embodiment, when the electronic device 100 is in an intermediate state, the first housing structure 110 and the second housing structure 120 may be angled therebetween at a predetermined angle, e.g., 90 degrees or 120 degrees. For example, in the intermediate state, the first area 131a and second area 131b of the display 130 may be angled therebetween at an angle larger than the angle when it is in the folded state and smaller than the angle when it is in the unfolded state. The folding area 131c may at least partially have a curved surface with a predetermined curvature and, in this case, the curvature may be smaller than that when it is in the folded state.

FIG. 3 is an exploded perspective view illustrating an electronic device 100 according to an embodiment of the disclosure.

Referring to FIG. 3, according to an embodiment, an electronic device 100 may include a display 130, a supporting member assembly 160, at least one printed circuit board 170, a first housing structure 110, a second housing structure 120, a first back cover 140, and a second back cover 150. In the disclosure, the display 130 may be interchangeably used with a display module or display assembly.

The display 130 may include a display panel 131 (e.g., a flexible display panel) and one or more plates 132 or layers seated on the display panel 131. According to an embodiment, the plate 132 may be disposed between the display panel 131 and the supporting member assembly 160. The display panel 131 may be disposed on at least a portion of one surface (e.g., the Z-axis facing surface of FIG. 3) of the plate 132. The plate 132 may have a shape corresponding to the display panel 131. For example, a portion of the plate 132 may have a shape corresponding to the shape of the notch area 133 of the display panel 131.

The supporting member assembly 160 may include a first supporting member 161, a second supporting member 162, a hinge structure 164 disposed with the first supporting member 161 and the second supporting member 162, a hinge cover 165 covering the hinge structure 164 when the hinge structure 164 is viewed from the outside, and a wiring member 163 (e.g., a flexible printed circuit board (FPCB)) crossing the first supporting member 161 and the second supporting member 162.

According to an embodiment, the supporting member assembly 160 may be disposed with the plate 132 and at least one printed circuit board 170. As an example, the first supporting member 161 may be disposed with the first area 131a of the display 130 and a first printed circuit board 171. The second supporting member 162 may be disposed with the second area 131b of the display 130 and a second printed circuit board 172.

According to an embodiment, the wiring member 163 and the hinge structure 164 may be at least partially disposed inside the supporting member assembly 160. The wiring member 163 may be disposed in a direction (e.g., the x-axis direction) crossing the first supporting member 161 and the second supporting member 162. The wiring member 163 may be disposed in a direction (e.g., the x-axis direction) perpendicular to the folding axis (e.g., the folding axis A of FIG. 1 or the y axis) of the folding area 131c.

According to an embodiment, the hinge structure 164 may include a hinge module 164a, a first hinge plate 164b, and/or a second hinge plate 164c. According to an embodiment, the first hinge plate 164b may be mounted inside the first housing structure 110, and the second hinge plate 164c may be mounted inside the second housing structure 120. According to an embodiment, the first hinge plate 164b may be directly mounted on the first supporting member 161, and the second hinge plate 164c may be directly mounted on the second supporting member 162. According to an embodiment, the first hinge plate 164b (or second hinge plate 164c) may be directly mounted in other structure (e.g., a first rotation supporting surface 114 or second rotation supporting surface 124) inside the first housing structure 110 (or the second housing structure 120). For example, the structure in which the first hinge plate 164b (or the second hinge plate 164c) is mounted inside the first housing structure 110 (or the second housing structure 120) may be varied according to embodiments. In another embodiment, the hinge module 164a may be mounted on the first hinge plate 164b and the second hinge plate 164c, rotatably connecting the second hinge plate 164c to the first hinge plate 164b. For example, a folding axis (e.g., the folding axis A of FIG. 1) may be formed by the hinge module 164a, and the first housing structure 110 and the second housing structure 120 (or the first supporting member 161 and the second supporting member 162) may be rotated on each other substantially with respect to the folding axis A.

As mentioned above, the at least one printed circuit board 170 may include the first printed circuit board 171 disposed on the first supporting member 161 and the second printed circuit board 172 disposed on the second supporting member 162. The first printed circuit board 171 and the second printed circuit board 172 may be disposed inside a space formed by the supporting member assembly 160, the first housing structure 110, the second housing structure 120, the first back cover 140, and the second back cover 150. Components for implementing various functions of the electronic device 100 may be mounted on the first printed circuit board 171 and the second printed circuit board 172.

According to an embodiment, the first housing structure 110 and the second housing structure 120 may be assembled together to be coupled to both sides of the supporting member assembly 160, with the display 130 coupled to the supporting member assembly 160. The first housing structure 110 and the second housing structure 120 may be slidably coupled to two opposite sides of the supporting member assembly 160, e.g., the first supporting member 161 and the second supporting member 162, respectively. The first supporting member 161 and the second supporting member 162 may substantially be received in the first housing structure 110 and the second housing structure 120 and, according to an embodiment, may be interpreted as the respective portions of the first housing structure 110 and the second housing structure 120.

According to an embodiment, the first housing structure 110 may include a first rotation supporting surface 114, and the second housing structure 120 may include a second rotation supporting surface 124 corresponding to the first rotation supporting surface 114. The first rotation supporting surface 114 and the second rotation supporting surface 124 may include a curved surface corresponding to a curved surface included in the hinge cover 165.

According to an embodiment, when the electronic device 100 is in the unfolded state (e.g., the state as shown in FIG. 1), the first rotation supporting surface 114 and the second rotation supporting surface 124 may cover the hinge cover 165, allowing the hinge cover 165 to be not or minimally exposed to the back surface of the electronic device 100. According to an embodiment, when the electronic device 100 is the folded state (e.g., the state as shown in FIG. 2), the first rotation supporting surface 114 and the second rotation supporting surface 124 may rotate along the curved surface of the hinge cover 165, maximally exposing the hinge cover 165 to the back surface of the electronic device 100.

In the above description, the ordinal numbers as in the first housing structure 110, second housing structure 120, first side surface member 113 and the second side surface member 123 have been used merely for distinguishing the components, and it should be noted that the scope of the disclosure is not limited by the use of ordinal numbers. For example, although the sensor area 131d is formed in the first housing structure 110 in the above example, the sensor area 131d may be formed in the second housing structure 120 or in each of the first housing structure 110 and the second housing structure 120. According to an embodiment, although the first back surface area 141 and the sub display 152 are disposed in the first back cover 140 and the second back cover 150, respectively, the first back surface area 141 for placing, e.g., a sensor, and the sub display 152 for outputting screen, both, may be disposed in either the first back cover 140 or the second back cover 150.

The following description is made with reference to FIGS. 1 to 3 as necessary. In the following embodiments, the components identical to those in the above embodiments or easy to understand from the description of the above embodiments are denoted with or without the same reference numerals and their detailed description may be skipped. In the following description, the "state as shown in FIG. 1 in which the first housing structure 110 and the second housing structure 120 are unfolded side-by-side" may be denoted a "first position," and the "state in which the first housing structure 110 and the second housing structure 120 are folded to face each other" may be denoted a "second position."

Figure 4:
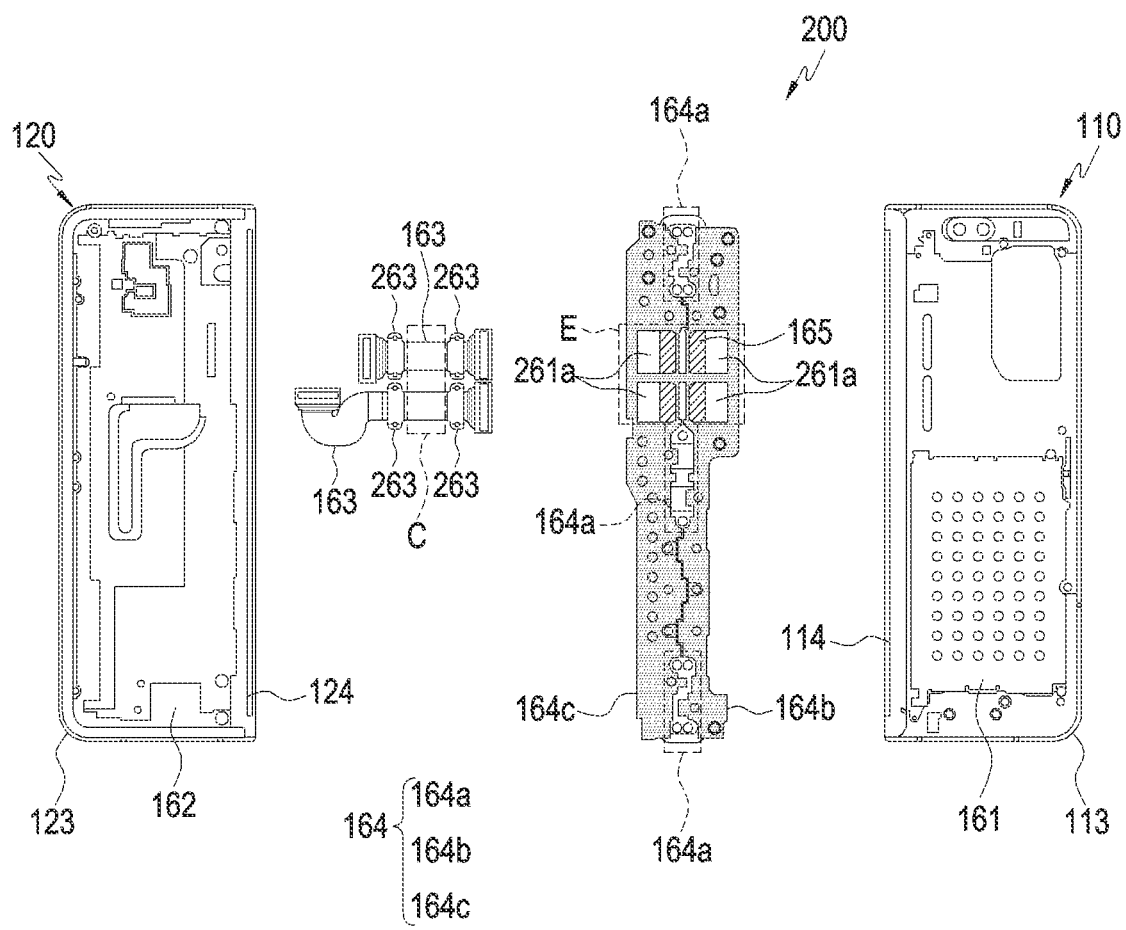
FIG. 4 is a plan view illustrating some components of an electronic device according to an embodiment of the disclosure.

FIG. 4 is a plan view illustrating some components of an electronic device 200 (e.g., the electronic device 100 of FIGS. 1 to 3) according to an embodiment of the disclosure.

Figure 5:
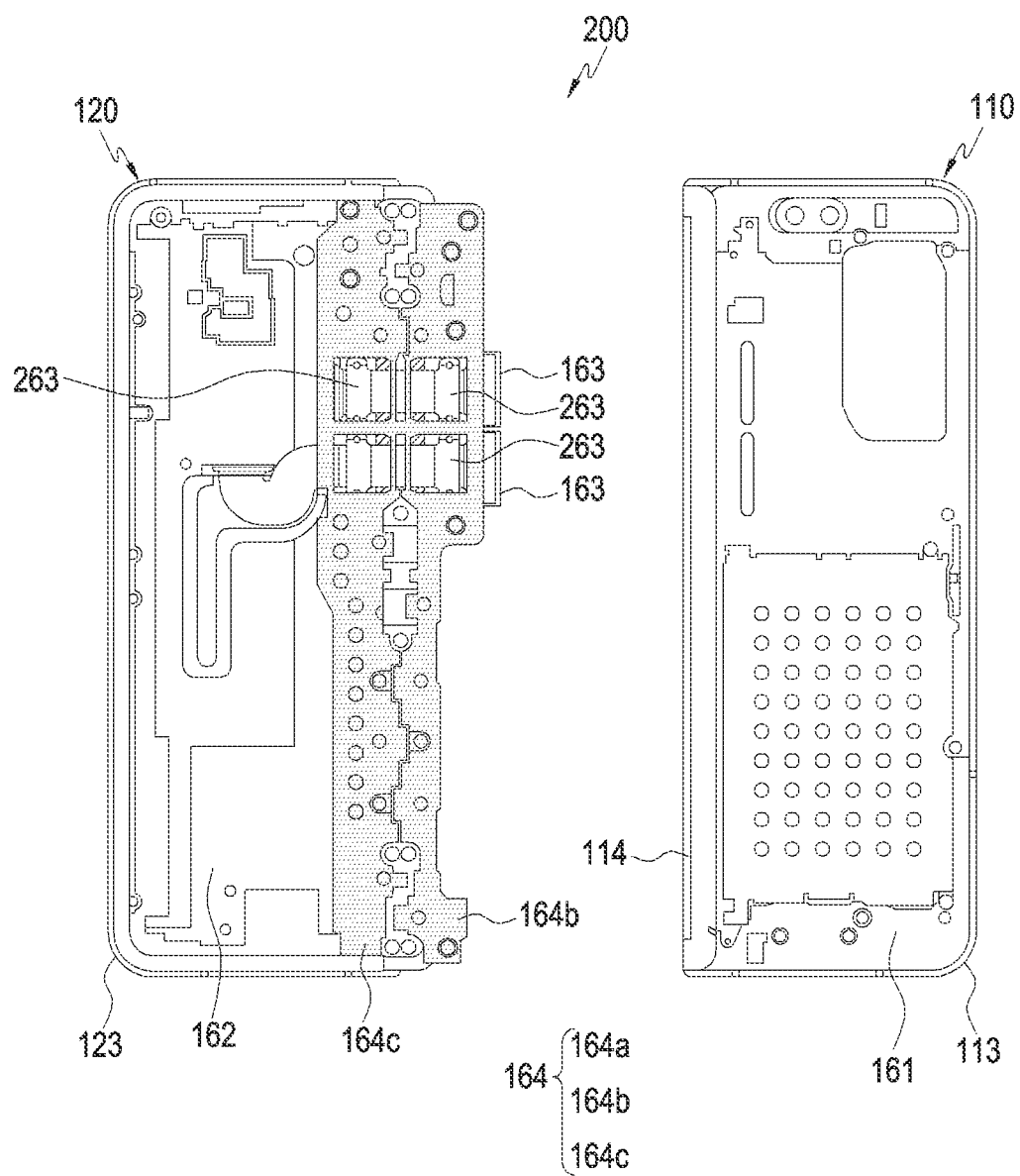
FIGS. 5 and 6 are plan views illustrating a combined structure of the components of FIG. 4 according to various embodiments of the disclosure.
Figure 6:
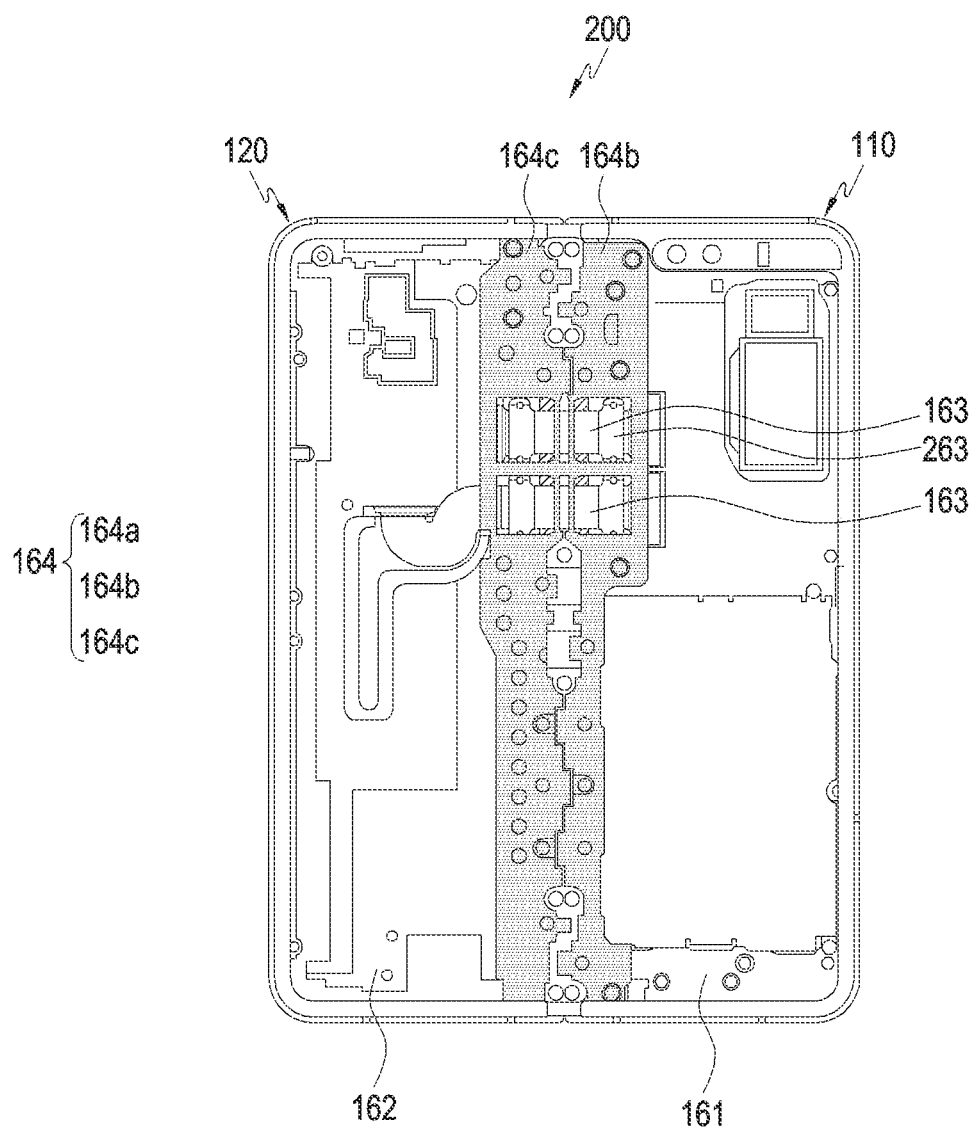

FIGS. 5 and 6 are plan views illustrating a combined structure of the components of FIG. 4 according to various embodiments of the disclosure.

Referring to FIGS. 4, 5, and 6, the electronic device 200 may include housing structures (e.g., the first housing structure 110 and second housing structure 120 of FIGS. 1 to 3), supporting members (e.g., the first supporting member 161 and the second supporting member 162 of FIG. 3), a flexible printed circuit board (e.g., the wiring structure or flexible printed circuit board 163 of FIG. 3), a hinge module(s) (e.g., the hinge module 164a of FIG. 3), and/or hinge plates (e.g., the first hinge plate 164b and second hinge plate 164c of FIG. 3).

According to an embodiment, the first supporting member 161 or the second supporting member 162 may be mounted inside the first housing structure 110 or the second housing structure 120. For example, the first supporting member 161 may be disposed between the display (e.g., the display 130 of FIG. 3) and a first printed circuit board (e.g., the first printed circuit board 171 of FIG. 3), and the second supporting member 162 may be disposed between the display 130 and a second printed circuit board (e.g., the second printed circuit board 172 of FIG. 3). According to an embodiment, the first hinge plate 164b and the second hinge plate 164c may be coupled to be rotatable on the hinge module 164a with respect to each other. The first hinge plate 164b may be mounted on the first supporting member 161, and the second hinge plate 164c may be mounted on the second supporting member 162. For example, the first housing structure 110 (or the first supporting member 161) may be rotatably coupled with the second housing structure 120 (or the second supporting member 162) via the hinge structure 164 (e.g., the hinge module 164a, the first hinge plate 164b, and/or the second hinge plate 164c)).

According to an embodiment, the first hinge plate 164b or the second hinge plate 164c may include at least one opening 261a. The opening 261a may be formed through the first hinge plate 164b or the second hinge plate 164c in a direction (e.g., the z direction of FIG. 3) in which the display 130 faces. As described below with reference to FIG. 7, the first hinge plate 164b or the second hinge plate 164c may further include a frame portion (e.g., the frame portion 361b of FIG. 7) surrounding at least a portion of the opening 261a. For example, the frame portion 361b may be a structure defining at least a portion of the opening 261a and may form a portion of an edge of the first hinge plate 164b or the second hinge plate 164c.

According to an embodiment, the first hinge plate 164b or second hinge plate 164c, along with the first supporting member 161 or the second supporting member 162, may support the display 130. For example, a folding area (e.g., the folding area 131c of FIG. 1 or 3) of the display 130 may be at least partially supported by the first hinge plate 164b or the second hinge plate 164c. According to an embodiment, when there is the user's touch (e.g., a touch input), the display 130 may be deformed in the area corresponding to the opening 261a. The frame portion 361b may support at least a portion of the display 130 in the folding area 131c, thereby preventing the display 130 from deforming due to an external environment (e.g., the user's touch).

According to an embodiment, there may be provided one or more flexible printed circuit boards 163 which may cross the hinge structure 164 (e.g., the first hinge plate 164b or the second hinge plate 164c) and extend from the inside of the first housing structure 110 to the inside of the second housing structure 120. For example, the flexible printed circuit board 163 may electrically connect an internal component (e.g., the first printed circuit board 171 of FIG. 3) of the first housing structure 110 and an internal component (e.g., the second printed circuit board 172 of FIG. 3) of the second housing structure 120. According to an embodiment, the flexible printed circuit board 163 may be disposed across the opening 261a. For example, when viewed from above a first surface (e.g., the first surface 111 of FIG. 1) or a third surface (e.g., the third surface 121 of FIG. 1) of the display 130, a portion of the flexible printed circuit board 163 may be disposed to overlap the opening 261a. According to an embodiment, some portion (e.g., the portion C of FIG. 4) of the flexible printed circuit board 163 may be disposed in the internal space of the hinge cover (e.g., the hinge cover 165 of FIG. 3) while remaining in a curved shape (e.g., the letter U shape). When the electronic device 200 transforms between a first position (e.g., the position or shape as shown in FIG. 1) in which the electronic device 200 unfolds and a second position (e.g., the position or shape as shown in FIG. 2), the flexible printed circuit board 163 (e.g., the portion C of FIG. 4) may be transformed corresponding to the transforming of the electronic device 200.

According to an embodiment, the flexible printed circuit board 163 may be disposed curved inside the hinge cover 165 and, in that position, the flexible printed circuit board 163 may tend to turn back flat (e.g., accumulating elastic restorative force). The accumulated elastic restorative force may deform a portion of the flexible printed circuit board 163. For example, by the elastic restorative force, the flexible printed circuit board 163 may contact or rub against other structures (or electronic components) inside the electronic device 200. According to an embodiment, it may be hard to predict the deformation of the flexible printed circuit board 163 by the elastic restorative force when the electronic device 200 transforms. According to an embodiment, the electronic device 200 may further include a fixing member 263, permitting deformation of the flexible printed circuit board 163 in the internal space of the hinge cover 165 and restricting the deformation of the flexible printed circuit board 163 in the area or space off the hinge cover 165. For example, the fixing member 263 may set a portion that may be deformed in the flexible printed circuit board 163.

According to an embodiment, the fixing member 263 may be mounted on the first hinge plate 164b or the second hinge plate 164c, and a portion of the flexible printed circuit board 163 may be mounted or fastened to the fixing member 263. According to an embodiment, a pair of fixing members 263 may be mounted on the flexible printed circuit board 163, and one of the fixing members 263 may be mounted on the first hinge plate 164b, and the other may be mounted on the second hinge plate 164c. According to an embodiment, a portion (hereinafter, a 'deforming portion C') of the flexible printed circuit board 163, which is positioned between the pair of fixing members 263 may be disposed inside the hinge cover 165. For example, in the deformation of the electronic device 200, the deforming portion C of the flexible printed circuit board 163 may be deformed inside the hinge cover 165. Thus, it may be predicted that when the electronic device 200 transforms, the deformation of the flexible printed circuit board 163 will occur at the deforming portion C, and a measure may easily be taken to prevent contact or friction of the flexible printed circuit board 163 to other structure(s).

According to an embodiment, the fixing member 263 may be disposed in the opening 261a. For example, the fixing member 263 may be substantially received in the opening 261a, and two opposite ends of the fixing member 263 may be fastened, at the edge of the opening 261a, to the first hinge plate 164b or the second hinge plate 164c. According to an embodiment, allowing the fixing member 263 to be received in the opening 261a may prevent or reduce an increase in thickness due to a structure (e.g., the fixing member) which is disposed to overlap the first hinge plate 164b or the second hinge plate 164c. For example, the fixing member 263 may provide an environment in which the deformation of the flexible printed circuit board 163 is predictable while suppressing an increase in the thickness of the electronic device 200 by being at least partially received in the opening 261a.

According to an embodiment, the electronic device 200 may include an elastic member (e.g., the elastic member 365 of FIGS. 7 to 9), preventing wear or friction between the internal structures or electronic components of the electronic device 200. The configuration of the elastic member 365 is described below in greater detail with reference to FIGS. 7 and 8.

Figure 7:
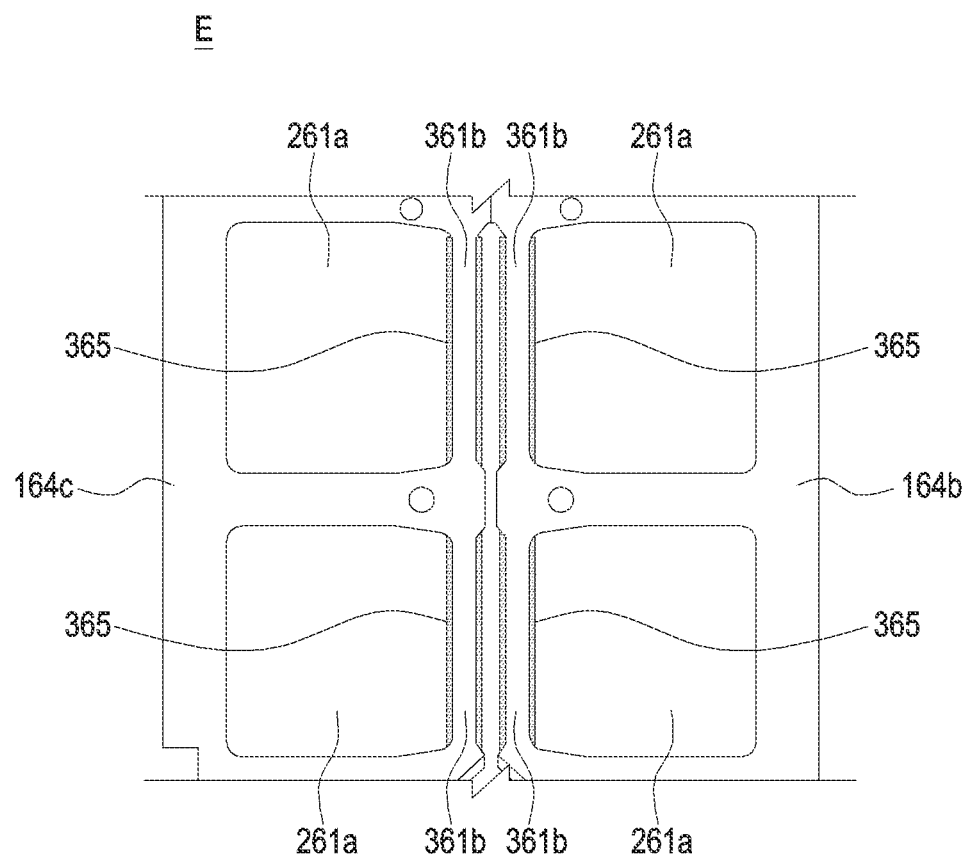
FIGS. 7 and 8 are enlarged views of area E of FIG. 4 according to various embodiments of the disclosure.
Figure 8:
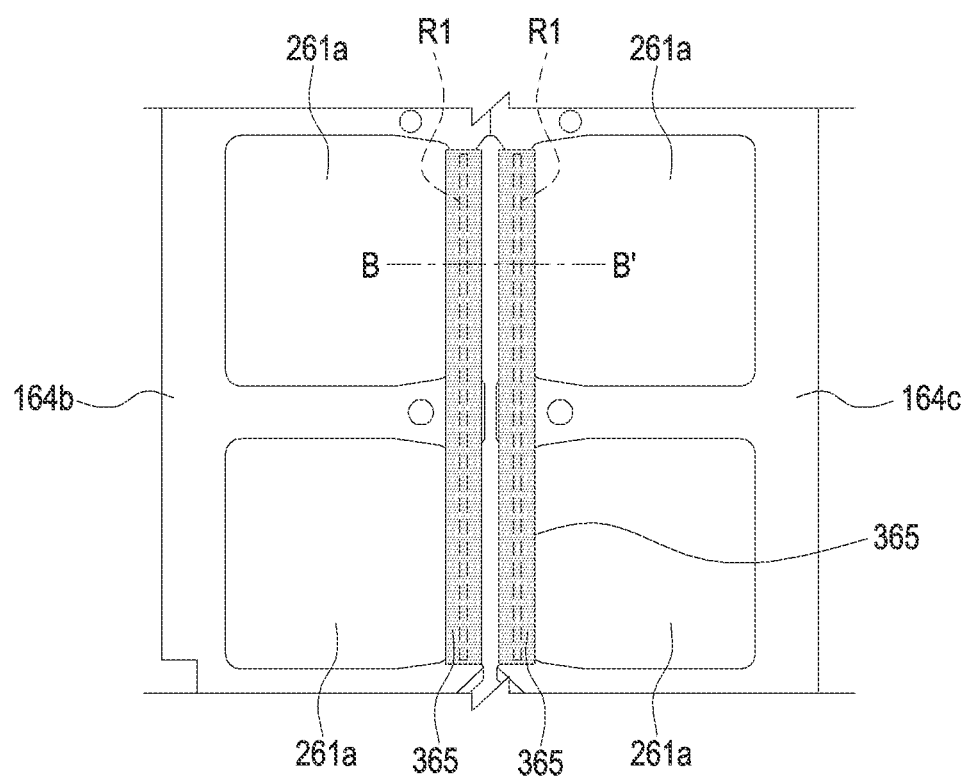

FIGS. 7 and 8 are enlarged views of area E of FIG. 4 according to various embodiments of the disclosure.

Referring to FIGS. 7 and 8, the elastic member 365 may be disposed in the frame portion 361b. As described below with reference to FIG. 9, the elastic member 365 may be attached to the frame portion 361b and be positioned to face the flexible printed circuit board 163. For example, the elastic member 365 may be disposed, at least, between the flexible printed circuit board 163 and the frame portion 361b. According to an embodiment, a portion adjacent to the deforming portion (e.g., the deforming portion C of FIG. 4) of the flexible printed circuit board 163 may be formed of a synthetic resin. For example, at least, the frame portion 361b or first hinge plate 164b (or the second hinge plate 164c) may be formed of a synthetic resin. According to an embodiment, as other structure, e.g., at least the frame portion 361b, around the deforming portion C is formed of a synthetic resin, the flexible printed circuit board 163 may be prevented from wear or damage despite contact or friction.

According to an embodiment, a plurality of openings 261a may be formed in each of the first hinge plate 164b and the second hinge plate 164c and may be disposed adjacent to each other in the position (e.g., the first position) of FIG. 1. For example, the frame portion 361b may be formed in each of the first hinge plate 164b and the second hinge plate 164c and, as shown in FIG. 7, the frame portions 361b may be disposed side-by-side in the first position as shown in FIG. 7. The electronic device 200 may include a plurality of elastic members 365 disposed (or attached) in the frame portions 361b. For example, the elastic member disposed on the first hinge plate 164b and the elastic member disposed on the second hinge plate 164c may be disposed side-by-side in the first position as shown in FIG. 8.

According to an embodiment, the openings 261a formed in the first hinge plate 164b and the second hinge plate 164c may be disposed to face each other in the position (e.g., the second position) of FIG. 2, and the elastic members 365 may be disposed to face each other, with at least portions of (e.g., the frame portions 361b) the first hinge plate 164b and the second hinge plate 164c disposed therebetween. According to an embodiment, the flexible printed circuit board 163 may be disposed to face one surface (e.g., the surface where the elastic member 365 is disposed) of each of the first hinge plate 164b and the second hinge plate 164c and, at least in the area corresponding to the frame portion 361b, may be disposed to face the elastic member 365.

According to an embodiment, the elastic member 365 may include a flexible or elastic material, such as sponge, silicone, or urethane. An attaching area R1 may be formed on the surface facing the first hinge plate 164b or the second hinge plate 164c (e.g., the frame portion 361b). For example, the elastic member 365 may be attached to the first hinge plate 164b or the second hinge plate 164c. According to an embodiment, as shown in FIG. 7, when viewed from above the first surface or third surface (e.g., the first surface 111 or third surface 121 of FIG. 1) of the electronic device 200, a portion of the elastic member 365 may be disposed to overlap the opening 261a or another portion may project from the edge of the first hinge plate 164b or the second hinge plate 164c. For example, on the surface where the attaching area R1 is formed, the elastic member 365 may include an area which is not attached to the frame portion. According to an embodiment, the area which is not attached to the frame portion 361b on one surface of the elastic member 365 may include an area with no adhesive (e.g., the non-attaching area R2 of FIG. 9). According to an embodiment, at least a portion of the non-attaching area R2 may be disposed to directly face the frame portion 361b. According to an embodiment, another portion of the non-attaching area R2 may be disposed to project beyond the edge of the first hinge plate 164b or the second hinge plate 164c.

Figure 9:
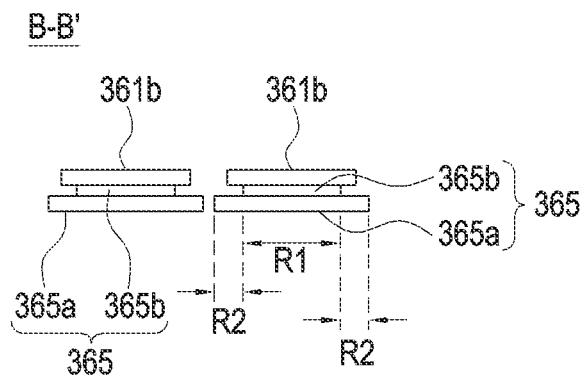
FIGS. 9, 10, and 11 are cross-sectional views illustrating various example elastic members, as taken by cutting a hinge plate(s) along line B-B' of FIG. 8, according to various embodiments of the disclosure.
Figure 10:
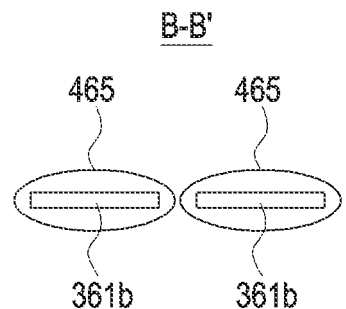
Figure 11:
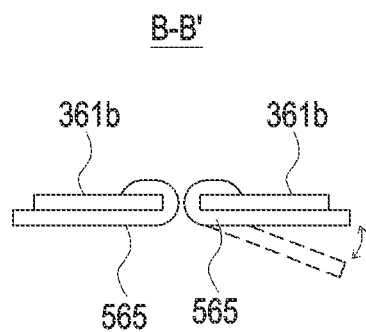

FIGS. 9, 10, and 11 are cross-sectional views illustrating various example elastic members, as taken by cutting a hinge plate(s) along line B-B' of FIG. 8, according to various embodiments of the disclosure.

Referring to FIG. 9, the elastic member 365 may include an elastic material layer 365a shaped as a flat plate with a width larger than the frame portion 361b and, as including the adhesive material layer 365b, the elastic member 365 or the elastic material layer 365a may be attached to the frame portion 361b. According to an embodiment, the elastic material layer 365a may include sponge, silicone, or urethane. For example, the elastic material layer 365a has flexibility or elasticity, thereby preventing wear or damage due to contact or friction with another structure. In FIG. 9, the adhesive material layer 365b may be formed of an adhesive material or adhesive tape applied substantially on one surface of the elastic material layer 365a. For example, although FIG. 9 illustrates the elastic material layer 365a and the adhesive material layer 365b as separate layers, the thickness of the adhesive material layer 365b may be substantially too small to be recognized with the naked eye.

According to an embodiment, the area (e.g., the attaching area R1) where the adhesive material layer 365b is provided may be smaller than the width and length of the elastic member 365 (e.g., the elastic material layer 365a). For example, at least a portion, around the attaching area R1, of the surface facing the frame portion 361b may be the non-attaching area R2 where no adhesive material is provided. According to an embodiment, the non-attaching area R2 may be shaped substantially as a polygon or closed curve (or area) surrounding the attaching area R1, and at least a portion of the non-attaching area R2 may be disposed to directly face the frame portion 361b. For example, the attaching area R1 may be formed in a width and length smaller than the width and length of the frame portion 361b. Thus, the adhesive material between the frame portion 361b and the elastic material layer 365a may be positioned substantially in the area which the frame portion 361b or elastic material layer 365a provides.

Referring to FIG. 10, the elastic member 465 may be formed to substantially surround the frame portion 361b. For example, the elastic member 465 may be formed of silicone or urethane to surround the outer circumferential surface of the frame portion 361b. According to an embodiment, if the elastic member 465 is formed of silicone or urethane, the elastic member 465 may be formed in such a manner as to wrap around the frame portion 361b by insert molding or liquid silicone molding. According to an embodiment, if the elastic member 465 is formed by insert molding or liquid silicone molding, the elastic member 465 may be formed, attached or coupled to the frame portion 361b, although not including the adhesive material layer (e.g., the adhesive material layer 365b of FIG. 9).

Referring to FIG. 11, the elastic member 565 may be formed to surround one surface of the frame portion 361b while partially surrounding another surface of the frame portion 361b. The elastic member 565 shown in FIG. 11 may be attached to the frame portion 361b via an adhesive material (e.g., the adhesive material layer 365b of FIG. 9). Before attached to the frame portion 361b, the elastic member 565 may be deformed to various shapes within a predetermined range. According to an embodiment, if formed of silicone or urethane, the elastic member 565 may be attached to the frame portion 361b while being simultaneously formed by insert molding.

According to an embodiment, the above-described elastic member, e.g., the elastic member 365, 465, or 565 of FIGS. 7 to 11, may be disposed to at least partially surround the frame portion 361b, preventing the flexible printed circuit board 163 from directly contacting the frame portion 361b. For example, the elastic member 365, 465, or 565 may prevent wear or damage which may arise when the flexible printed circuit board 163 contacts another structure (e.g., the frame portion 361b).

Figure 12:
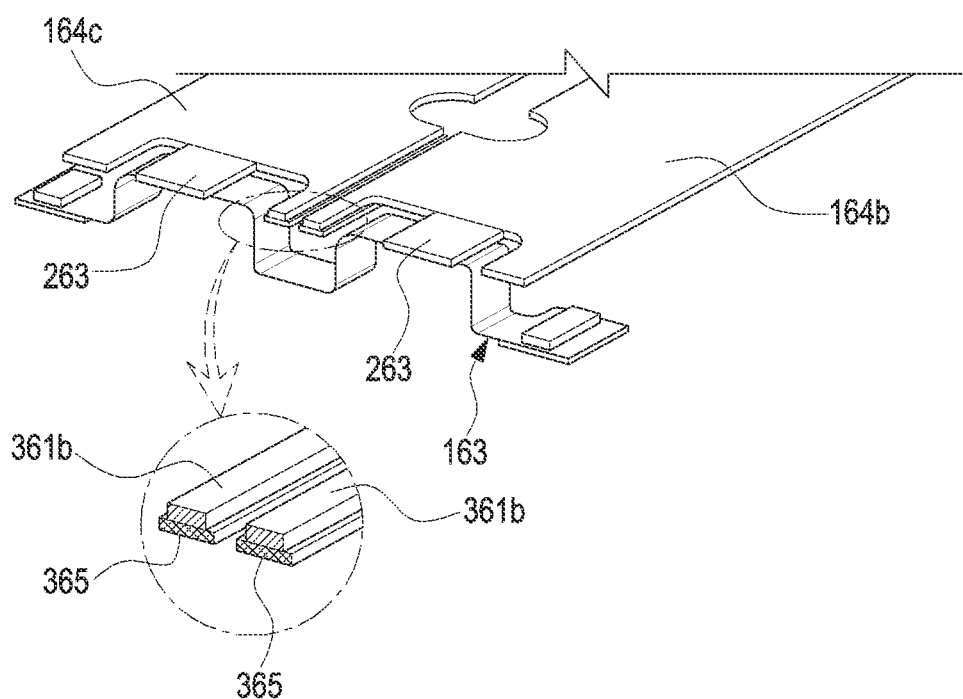
FIGS. 12 and 13 are views illustrating an unfolded state of housing structures of an electronic device according to various embodiment of the disclosure.
Figure 13:
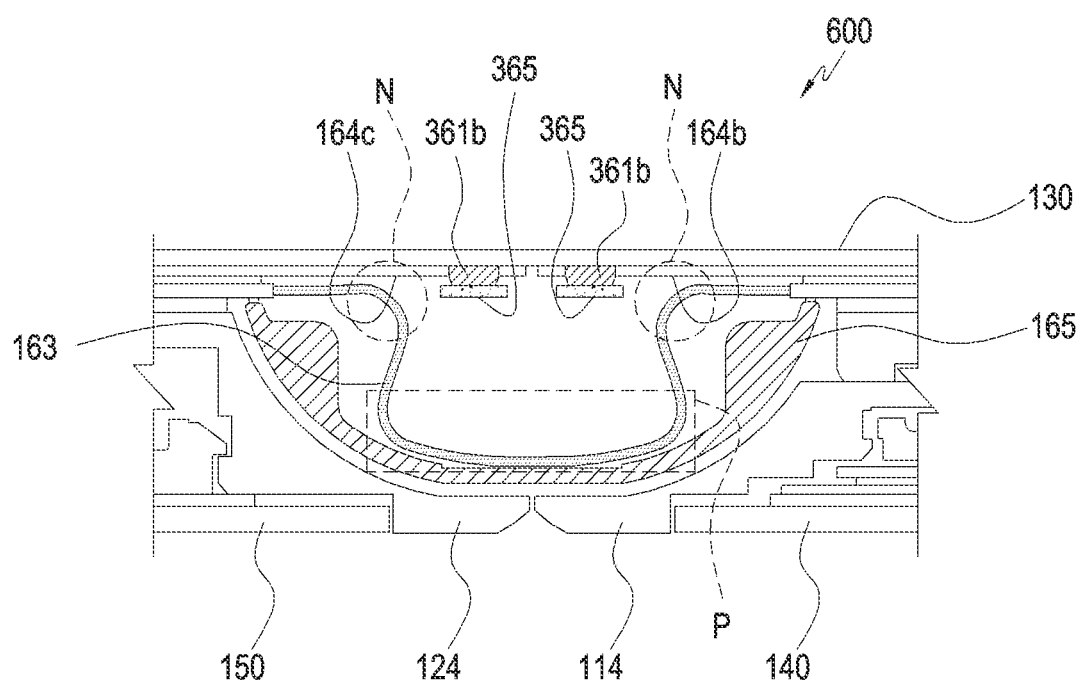

FIGS. 12 and 13 are views illustrating an unfolded state of housing structures (e.g., the first housing structure 110 and second housing structure 120 of FIGS. 1 to 4) of an electronic device 600 (e.g., the electronic device 100 or 200 of FIGS. 1 to 4) according to various embodiments of the disclosure.

Referring to FIGS. 12 and 13, in a first position, e.g., the unfolded state of the first housing structure and second housing structure (e.g., the first housing structure 110 and second housing structure 120 of FIGS. 1 to 4) of the electronic device 600, the flexible printed circuit board (e.g., the flexible printed circuit board 163 of FIG. 4) may be disposed substantially flat, and the deforming portion C (e.g., the deforming portion C of FIG. 4) may be curved (e.g., in the shape of the letter "U") inside the hinge cover 165. According to an embodiment, in the first position, the deforming portion C may include a portion with a positive curvature radius (hereinafter, a "first curved area P") and a portion with a negative curvature radius (hereinafter, a "second curved area N").

According to an embodiment, the elastic member (e.g., the elastic member 365 of FIGS. 7 to 9) may be attached to the first hinge plate 164b or the second hinge plate 164c (e.g., the frame portion(s) 361b of FIG. 7 or 9) and be disposed to face the flexible printed circuit board 163 (e.g., the first curved area P) in the first position. According to an embodiment, in the first position, the second curved area N may be positioned adjacent to the elastic member 365. For example, the second curved area N may be formed in each of the area corresponding to the first hinge plate 164b and the area corresponding to the second hinge plate 164c on the flexible printed circuit board 163. According to an embodiment, the first curved area P may be an area between the second curved areas N and may be disposed substantially in a shape with a positive curvature radius inside the hinge cover 165.

Figure 14:
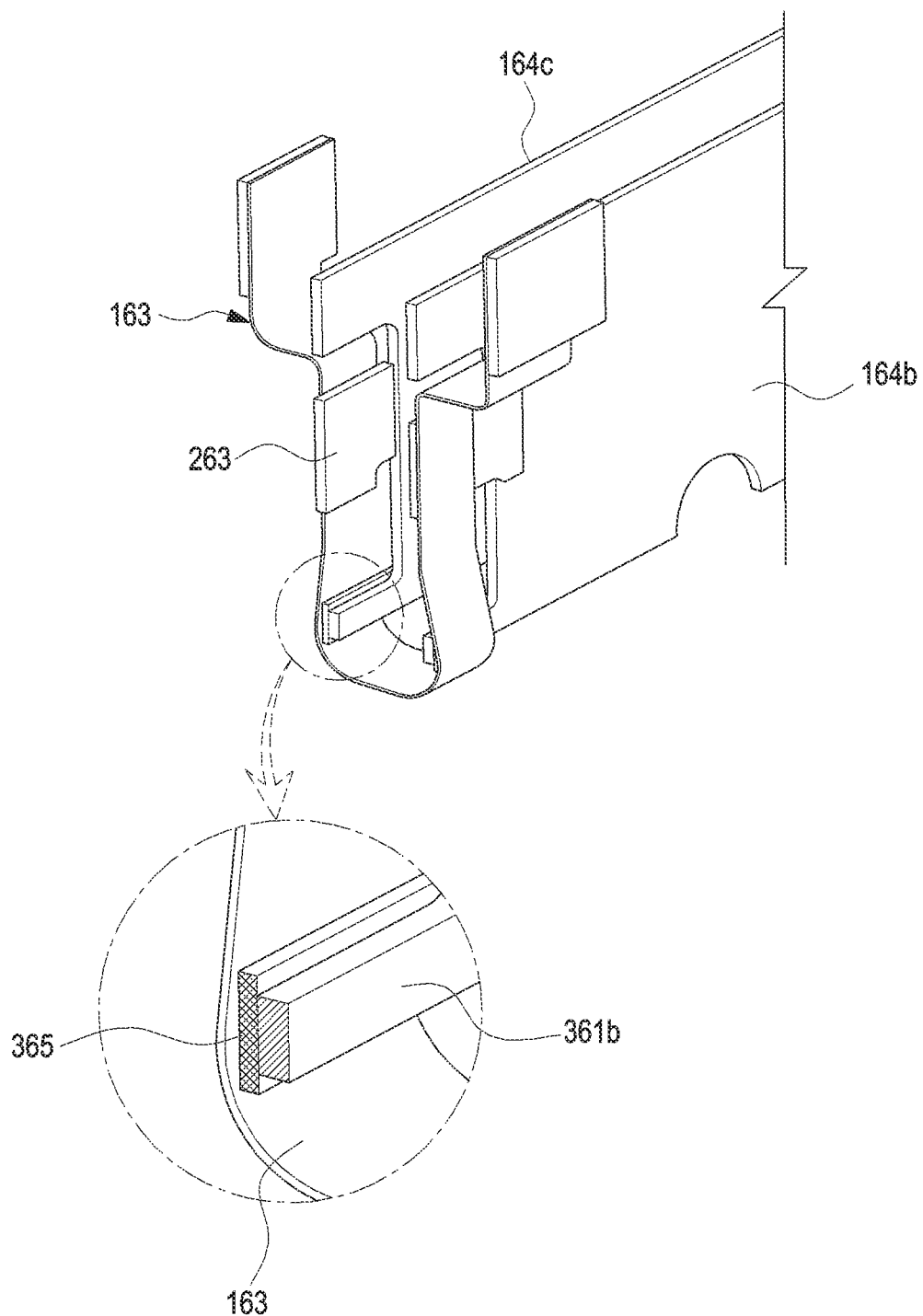
FIGS. 14 and 15 are views illustrating a folded state of housing structures of an electronic device according to various embodiments of the disclosure.
Figure 15:
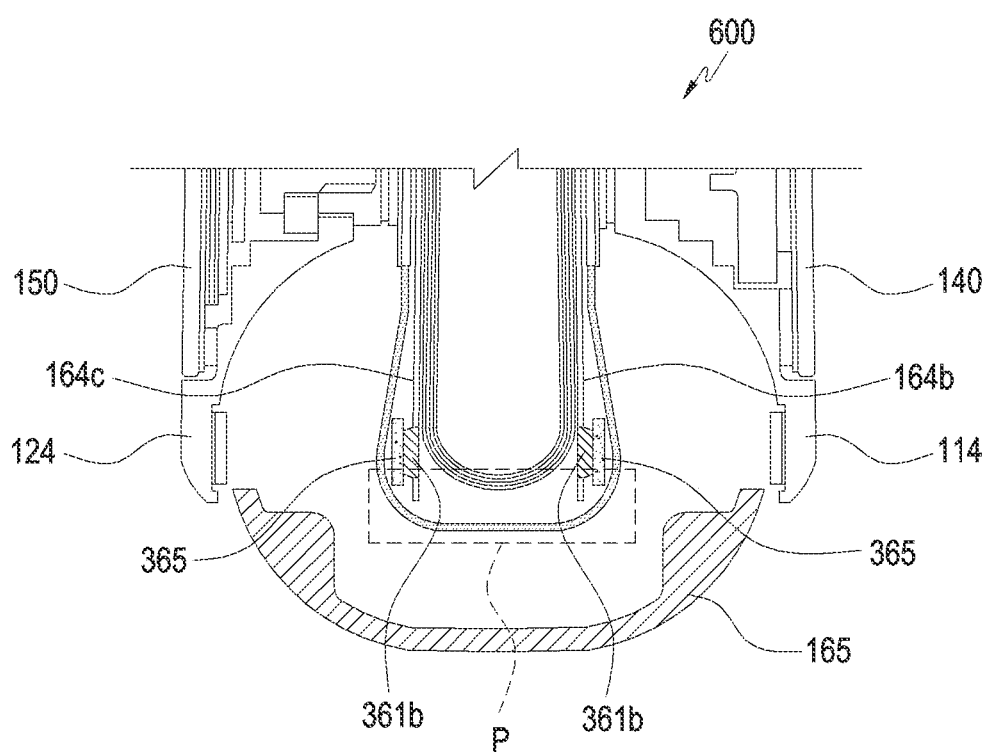

FIGS. 14 and 15 are views illustrating a folded state of housing structures (e.g., the first housing structure 110 and second housing structure 120 of FIGS. 1 to 4) of an electronic device 600 (e.g., the electronic device 100 or 200 of FIGS. 1 to 4) according to various embodiments of the disclosure.

Referring to FIGS. 14 and 15, the flexible printed circuit board 163 may be disposed substantially in the shape of the letter "U." For example, the deforming portion (e.g., the deforming portion C of FIG. 4) may be disposed to maintain the shape with the positive curvature, and the remaining portions of the flexible printed circuit board 163 may be disposed substantially in parallel with each other while facing each other. According to an embodiment, in the second position, a portion of the flexible printed circuit board 163 disposed inside the first housing structure 110 and another portion of the flexible printed circuit board 163 disposed inside the second housing structure 120 may be disposed to face each other and may be connected together via the deforming portion C. It should be noted here that the sentence "two different portions of the flexible printed circuit board 163 are disposed to face each other" describes a relative position shown in the cross-sectional view taken along line B-B' of FIG. 8 as obtained by cutting the electronic device (e.g., the electronic device 100 or 200 of FIGS. 1 to 6). According to an embodiment, if the electronic device 600 is projected along the z-axis direction of FIG. 3 in the folded state, two different portions of the flexible printed circuit board 163 may be disposed substantially in parallel with each other in positions offset from each other. For example, although the relative positions of the two different portions of the flexible printed circuit board 163 are mentioned in connection with the instant embodiment, it should be noted that embodiments of the disclosure are not limited thereto. According to an embodiment, another structure, e.g., a portion of the display 130, may be disposed between the two mutually-facing portions of the flexible printed circuit board 163.

According to an embodiment, when the electronic device 600 transforms between the first position and the second position, the shape or position of the flexible printed circuit board 163 may vary. For example, a look at the variations in curvature radius, based on comparison between FIGS. 13 and 15 reveals that the curvature radius of the second curved area N is substantially infinite in the second position and, in the first position, it is smaller than the curvature radius of the first curved area P. Regarding the variations in position between FIGS. 13 and 15, in the first position, the second curved area N is positioned adjacent to the frame portion 361b or the elastic member 365 and, in the second position, the first curved area P is positioned adjacent to the frame portion 361b or the elastic member 365 while substantially facing the frame portion 361b or the elastic member 365. According to an embodiment, regardless of the first position or second position, the flexible printed circuit board 163 may be disposed to partially face the display (e.g., the display 130 of FIG. 3), a predetermined interval away from the display.

According to an embodiment, the deformation or relocation of the flexible printed circuit board 163 due to the transformation of the electronic device 600 may be a cause of contact or friction to another structure. For example, as mentioned above, in the first position, the second curved area N may be positioned adjacent to the frame portion 361b and, in the second position, the first curved area P may be positioned adjacent to the frame portion 361b. According to an embodiment, the deformation of the flexible printed circuit board 163 by the accumulated elastic restorative force may be substantially difficult to predict. For example, the shape of the flexible printed circuit board 163 according to the distribution of the elastic restorative force may differ from the state shown in FIG. 13 or 15. If the state of the flexible printed circuit board 163 differs from that shown in FIG. 13 or 15, the second curved area N, in the first position, may come in contact with the frame portion 361b and, in the second position, the first curved area P may come in contact with the frame portion 361b.

According to an embodiment, the elastic member 365 is disposed substantially between the frame portion 361b and the flexible printed circuit board 163, thus preventing the flexible printed circuit board 163 from directly contacting the frame portion 361b. For example, when the flexible printed circuit board 163 deforms or moves to contact another structure (e.g., the frame portion 361b), the elastic member 365 may contact the flexible printed circuit board earlier than other structures. According to an embodiment, the elastic member 365 is formed of a flexible or elastic material and is disposed to contact the flexible printed circuit board 163. Thus, the elastic member 365 may suppress wear or damage due to contact or friction of the flexible printed circuit board 163. According to an embodiment, as the flexible printed circuit board 163 is disposed to rub against the elastic member, the flexible printed circuit board 163 may be prevented from damage due to contact or friction.

According to an embodiment, if the adhesive material (e.g., the adhesive material layer 365b of FIG. 9) is exposed to the outside of the elastic member 365, it may stick to, or contaminate, the flexible printed circuit board 163. The sticking of the adhesive material layer 365b or contamination of the flexible printed circuit board 163 by the adhesive material layer 365b may cause a noise when the flexible printed circuit board 163 deforms. According to an embodiment, in the electronic device (e.g., the electronic device 100, 200, or 600 of FIGS. 1 to 4, FIG. 13, or FIG. 15), a non-attaching area (e.g., the non-attaching area R2 of FIG. 9) may be provided around the adhesive material layer. For example, as set forth above in connection with the embodiment of FIG. 9, although the elastic member 365 includes an adhesive material layer (e.g., the adhesive material layer 365b of FIG. 9), the width or length of the adhesive material layer 365b may be smaller than the elastic member 365 (e.g., the elastic material layer 365a of FIG. 9) or the frame portion 361b, and the non-attaching area R2 may be formed around the adhesive material layer 365b. For example, although the flexible printed circuit board 163 contacts the elastic member 365, the non-attaching area R2 may prevent the flexible printed circuit board 163 from contamination due to the adhesive material.

FIGS. 16, 17, 18, 19, 20, and 21 are views illustrating example operations of manufacturing an elastic member (e.g., the elastic member 365 or 701 of FIG. 7 to 9 or 20) of an electronic device according to various embodiments of the disclosure.

Figure 16:
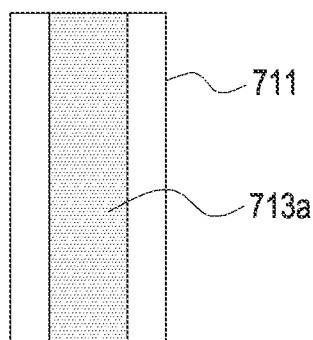
FIGS. 16, 17, 18, 19, 20, and 21 are views illustrating example operations of manufacturing an elastic member of an electronic device according to various embodiments of the disclosure.
Figure 17:
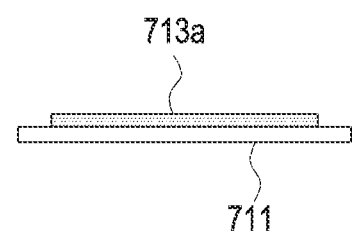

According to an embodiment, a release sheet 711 having an adhesive material 713a applied thereto is cut and attached to an elastic material layer 715 (e.g., the elastic material layer 365a of FIG. 9), forming an elastic member 701 (e.g., the elastic member 365 of FIGS. 7 to 9). FIGS. 16 and 17 are a plan view and cross-sectional view illustrating the release sheet 711 to which the adhesive material 713a has been applied.

Referring to FIGS. 16 and 17, the adhesive material 713a may be attached or applied to the release sheet 711 and may include a double-side tape or adhesive. The release sheet 711 is cut in the area where the adhesive material 713a is provided, forming the adhesive material layer 713b (e.g., the adhesive material layer 365b of FIG. 9) which is to be provided to the elastic member 701.

Figure 18:
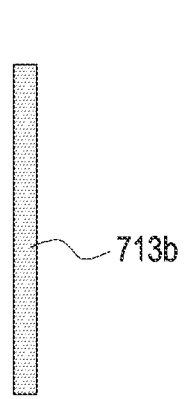
Figure 19:
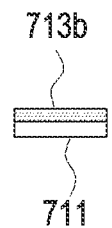

FIGS. 18 and 19 illustrate the shape of the cut-off release sheet 711 (e.g., the shape in which the adhesive material layer 713b has been formed). According to an embodiment, with the release sheet 711 cut off, the adhesive material layer 713b may be attached to the elastic material layer 715 (e.g., the elastic material layer 365a of FIG. 9).

Figure 20:
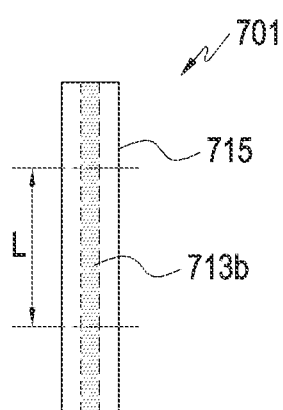
Figure 21:
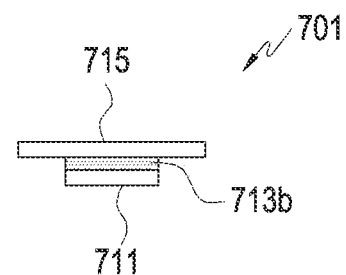

Referring to FIGS. 20 and 21, the adhesive material layer 713b may be attached to the elastic material layer 715, forming the elastic member 701. According to an embodiment, the elastic member 701 (e.g., the elastic material layer 715 and/or the adhesive material layer 713b) may be cut to a proper length depending on the size (e.g., length) or shape of the portion (e.g., the frame portion 361b of FIG. 7 or 9) to which the elastic member 701 is to be attached. For example, adjacent non-attaching areas (e.g., the non-attaching area R2 of FIG. 9) may be formed on both sides of the adhesive material layer 713b, but no non-attaching area may be provided on the top and bottom of the elastic material layer 715 of FIG. 20. The formed elastic member 701, or the elastic member 701 cut to a proper length, may be attached to the frame portion (e.g., the frame portion 361b of FIG. 7 or 9). Before attached to the frame portion 361b, the release sheet 711 may be removed, and the adhesive material layer 713b may attach the elastic material layer 715 to the frame portion 361b.

FIGS. 22, 23, 24, 25, 26, 27, and 28 are views illustrating example operations of manufacturing an elastic member (e.g., the elastic member 365 or 801 of FIG. 9 or 27) of an electronic device according to various embodiments of the disclosure.

Figure 22:
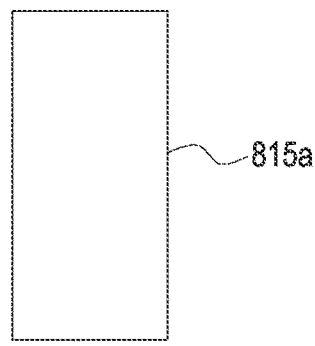
FIGS. 22, 23, 24, 25, 26, 27, and 28 are views illustrating example operations of manufacturing an elastic member of an electronic device according to various embodiments of the disclosure.
Figure 23:

Referring to FIGS. 22 and 23, an elastic material layer (e.g., the elastic material layer 815b) of an elastic member 801 may be formed by cutting a flat material 815a. According to an embodiment, an adhesive material layer (e.g., the adhesive material layer 813 of FIG. 25) may be formed by applying an adhesive material, with a mask 811 put in place.

Figure 24:
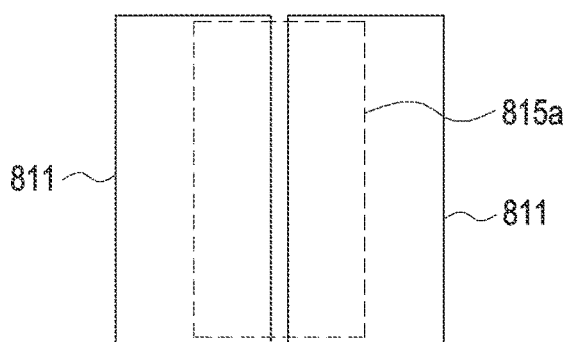

Referring to FIG. 24, the mask 811 may be placed and, with an area where the adhesive material layer 813 is to be formed exposed, the adhesive material may be sprayed or applied, forming the adhesive material layer 813 in some area of the material 815a.

Figure 25:
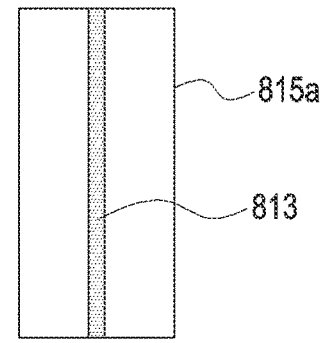
Figure 26:
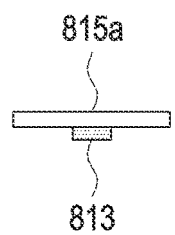

Referring to FIG. 25 or 26, it illustrates an example in which the adhesive material layer 813 has been formed. At least a portion, around the adhesive material layer 813, of one surface of the material 815a may include an area (e.g., the non-attaching area R2 of FIG. 9) where the adhesive material is not applied.

According to an embodiment, an elastic member (e.g., the elastic member 365 of FIG. 9) may be formed by forming the adhesive material layer 813 on one surface of the material 815a. For example, the elastic member itself of FIG. 25 or 26 may be attached to the frame portion 361b of FIG. 9.

Figure 27:
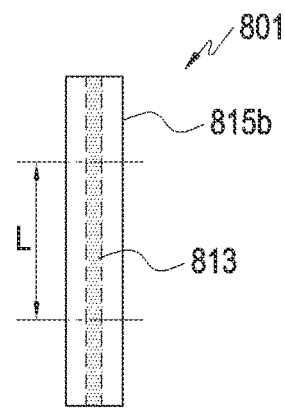
Figure 28:
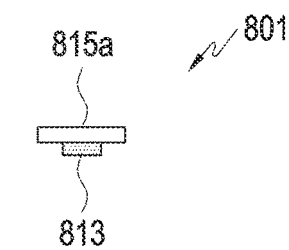

Referring to FIGS. 27 and 28, an elastic member (e.g., the elastic member 801 of FIGS. 27 and 28) which is to be applied to an actual product may be formed by partially removing the material 815a. For example, given, e.g., dimensional tolerances, the material 815*a* may be formed with a width or length larger than the elastic material layer (e.g., the elastic material layer 815*b* of FIGS. 27 and 28) which is to be applied to an actual product. After the adhesive material layer 813 is formed, a portion (e.g., a portion of the area where the adhesive material layer 813 is not provided) of the material 815*a* may be removed, forming the elastic material layer 815*b*. According to an embodiment, the elastic member 801 (e.g., the elastic material layer 815*b* and/or the adhesive material layer 813) may be cut to a proper length depending on the size (e.g., length) or shape of the portion (e.g., the frame portion 361*b* of FIG. 7 or 9) to which the elastic member 801 is to be attached. For example, adjacent non-attaching areas (e.g., the non-attaching area R2 of FIG. 9) may be formed on both sides of the adhesive material layer 813, but no non-attaching area may be provided on the top and bottom of the elastic material layer 815*b* of FIG. 27. The formed elastic member 801, or the elastic member 801 cut to a proper length, may be attached to the frame portion (e.g., the frame portion 361*b* of FIG. 7 or 9). Before attached to the frame portion 361*b*, a release sheet (e.g., the release sheet 711 of FIG. 21) may be provided to prevent the adhesive material layer 813 from contamination by, e.g., foreign bodies.

According to an embodiment, an electronic device (e.g., the electronic device 100, 200, or 600 of FIG. 1 to 4, 13, or 15) comprises a first housing structure (e.g., the first housing structure 110 of FIGS. 1 to 4) including a first surface (e.g., the first surface 111 of FIG. 1) facing in a first direction, a second surface (e.g., the second surface 112 of FIG. 1) facing in a second direction opposite to the first direction, and a first side surface member at least partially surrounding a space between the first surface and the side surface, a second housing structure (e.g., the second housing structure 120 of FIGS. 1 to 4) including a third surface (e.g., the third surface 121 of FIG. 1) facing in a third direction, a fourth surface (e.g., the fourth surface 122 of FIG. 1) facing in a fourth direction opposite to the third direction, and a second side surface member at least partially surrounding a space between the third surface and the fourth surface, a hinge structure (e.g., the hinge structure 164 of FIG. 3 or 4) rotatably connecting the first housing structure and the second housing structure, providing a folding axis (e.g., the folding axis A of FIG. 1) on which the first housing structure and the second housing structure rotate, and including a first hinge plate (e.g., the first hinge plate 164*b* of FIG. 3 or 4) mounted inside the first housing structure and a second hinge plate (e.g., the second hinge plate 164*c* of FIG. 3 or 4) mounted inside the second housing structure, at least one flexible printed circuit board (e.g., the flexible printed circuit board 163 of FIG. 3, 4, 13, or 15) crossing the first hinge plate and the second hinge plate and extending from an inside of the first housing structure to an inside of the second housing structure, and at least one elastic member (e.g., the elastic member 365 of FIG. 7, 9, 13, or 15) disposed on at least one of the first hinge plate and the second hinge plate in a position adjacent to the folding axis, wherein the elastic member is disposed between the first hinge plate and the flexible printed circuit board and/or between the second hinge plate and the flexible printed circuit board.

According to an embodiment, the elastic member may include an attaching area (e.g., the attaching area R1 of FIG. 9) formed on a surface facing the first hinge plate or the second hinge plate and a non-attaching area (e.g., the non-attaching area R2 of FIG. 9) formed in at least a portion of a circumference of the attaching area, on the surface facing the first hinge plate or the second hinge plate.

According to an embodiment, the non-attaching area may be shaped as a polygon or a closed curve surrounding the attaching area.

According to an embodiment, the elastic member may include sponge, silicone, or urethane.

According to an embodiment, the first hinge plate or the second hinge plate may include at least one opening (e.g., the opening 261*a* of FIG. 4, 7, or 8) formed through in the first direction or the second direction and a frame portion (e.g., the frame portion 361*b* of FIG. 7) formed to surround or define at least a portion of the opening. The elastic member may be attached to the frame portion.

According to an embodiment, the frame portion may form a portion of an edge of the first hinge plate or the second hinge plate.

According to an embodiment, when viewed from above the first surface or the third surface, a portion of the flexible printed circuit board may be disposed to overlap the opening.

According to an embodiment, the elastic member may include an attaching area formed on a surface facing the first hinge plate or the second hinge plate and a non-attaching area formed in at least a portion of a circumference of the attaching area, on the surface facing the first hinge plate or the second hinge plate. The attaching area may be attached to at least a portion of the frame portion.

According to an embodiment, the non-attaching area may be shaped as a polygon or closed curve surrounding the attaching area. At least a portion of the non-attaching area may be disposed to directly face the frame portion.

According to an embodiment, when viewed from above the first surface or the third surface, a portion of the non-attaching area may be disposed to overlap the opening or another portion of the non-attaching area protrudes from an edge of the first hinge plate or the second hinge plate.

According to an embodiment, the electronic device may further comprise a fixing member (e.g., the fixing member 263 of FIG. 4) disposed in the opening and including a first end and a second end fixed to the first hinge plate and the second hinge plate, respectively. A portion of the flexible printed circuit board may be mounted on the fixing member.

According to an embodiment, the first housing structure and the second housing structure may rotate on the hinge structure between a first position where the first surface and the third surface are unfolded side-by-side to a second position where the first surface and the third surface are folded to face each other.

According to an embodiment, the elastic member may include a first elastic member disposed on the first hinge plate and a second elastic member disposed on the second hinge plate. In the first position, the first elastic member and the second elastic member may be disposed adjacent to each other and side-by-side and, in the second position, the first elastic member and the second elastic member may be disposed to face each other, with the first hinge plate and the second hinge plate disposed therebetween.

According to an embodiment, the first hinge plate or the second hinge plate may include at least one opening formed through in the first direction or the second direction and a frame portion formed to surround or define at least a portion of the opening. The elastic member may be attached to the frame portion.

According to an embodiment, the elastic member may include an attaching area formed on a surface facing the first hinge plate or the second hinge plate and a non-attaching area formed in at least a portion of a circumference of the attaching area, on the surface facing the first hinge plate or the second hinge plate. The attaching area may be attached to at least a portion of the frame portion.

According to an embodiment, an electronic device (e.g., the electronic device 100, 200, or 600 of FIG. 1 to 4, 13, or 15) comprises a first housing structure, a second housing structure, a hinge structure rotatably connecting the first housing structure and the second housing structure and including a first hinge plate mounted inside the first housing structure and a second hinge plate mounted inside the second housing structure, at least one flexible printed circuit board crossing the first hinge plate and the second hinge plate and extending from an inside of the first housing structure to an inside of the second housing structure, and elastic members individually disposed on the first hinge plate and the second hinge plate and at least partially facing the flexible printed circuit board, wherein the elastic members include an attaching area formed on a surface facing the first hinge plate or the second hinge plate and a non-attaching area formed to abut at least two opposite sides of the attaching area on the surface facing the first hinge plate or the second hinge plate.

According to an embodiment, the first housing structure and the second housing structure may rotate on the hinge structure between a first position where the first housing structure and the second housing structure are unfolded side-by-side to a second position where the first housing structure and the second housing structure are folded to face each other. In the first position, the elastic members may be disposed adjacent to each other and side-by-side and, in the second position, the elastic members are disposed to face each other, with the first hinge plate and the second hinge plate disposed therebetween.

According to an embodiment, the first hinge plate or the second hinge plate may include at least one opening formed through in the first direction or the second direction and a frame portion formed to surround or define at least a portion of the opening, wherein the attaching area is attached to the frame portion. At least a portion of the non-attaching area may be disposed to directly face the frame portion.

According to an embodiment, the electronic device may further comprise a fixing member disposed in the opening and including a first end and a second end fixed to the first hinge plate and the second hinge plate, respectively. A portion of the flexible printed circuit board may be mounted on the fixing member and be disposed on the opening.

According to an embodiment, the frame portion may form a portion of an edge of the first hinge plate or the second hinge plate.

According to an embodiment, the at least one flexible printed circuit board includes a deformable portion.

According to an embodiment, the deformable portion comprises a synthetic resin.

According to an embodiment, the deformable portion includes a first portion with a positive curvature radius, and a second portion with a negative curvature radius.

As is apparent from the foregoing description, according to various embodiments, the elastic member may be placed between the structures or electronic components which contact or rub against each other while the electronic device transforms. For example, the elastic member may secure or maintain a predetermined gap between the adjacent structures or electronic components. According to an embodiment, if a contact or friction occurs while the electronic device transforms, the elastic member may prevent direct contact between the adjacent structures or electronic components, suppressing wear or damage to the structures. According to an embodiment, although the electronic device is repeatedly transformed, the elastic member may mitigate or prevent wear to the internal structures or electronic components due to contact or friction and enhance the durability of the electronic device (e.g., the internal structures or electronic components).

While the disclosure has been shown and described with reference to various embodiments thereof, it will be apparent to those of ordinary skill in the art that various changes in form and detail may be made thereto without departing from the spirit and scope of the disclosure as defined by the appended claims and their equivalents.

What is claimed is:

1. An electronic device, comprising:
a first housing structure;
a second housing structure;
a hinge cover;
a hinge structure rotatably connecting the first housing structure and the second housing structure while being covered by the hinge cover; and
a flexible printed circuit board crossing the hinge structure and extending from an inside of the first housing structure to an inside of the second housing structure via a first opening and a second opening and the flexible printed circuit board including fixed portions and a flexible portion between the fixed portions, and
wherein the hinge structure includes:
a first flexible material member attached adjacent to the first opening; and
a second flexible material member attached adjacent to the second opening, and
wherein the first flexible material member and the second flexible material member are configured to prevent direct contact between the hinge structure and the flexible portion of the flexible printed circuit board during folding or unfolding of the electronic device.

2. The electronic device of claim 1, wherein the first flexible material member and the second flexible material member are configured to direct contact between metal portions of the hinge structure and the flexible portion of the flexible printed circuit board during folding or unfolding of the electronic device.

3. The electronic device of claim 1, wherein the first flexible material member and the second flexible material member include an adhesive material applied on a surface facing the hinge structure.

4. The electronic device of claim 1,
wherein the hinge structure includes a first hinge plate mounted inside the first housing structure and a second hinge plate mounted inside the second housing structure, and
wherein the first opening is formed in the first hinge plate and the second opening is formed in the second hinge plate.

5. The electronic device of claim 4, further comprising:
a pair of fixing members mounted or fastened to respective one of the first hinge plate and the second hinge plate,
wherein the pair of fixing members are at least partially disposed in the first opening or the second opening.

6. The electronic device of claim 4, wherein the first flexible material member or the second flexible material member includes:
an attaching area formed on a surface facing the first hinge plate or the second hinge plate; and
a non-attaching area formed in at least a portion of a circumference of the attaching area, on the surface facing the first hinge plate or the second hinge plate.

7. The electronic device of claim 6, wherein the non-attaching area is shaped as at least one of a polygon or a closed curve surrounding the attaching area.

8. The electronic device of claim 4,
wherein the first hinge plate or the second hinge plate includes a frame portion formed to surround or define at least a portion of the first opening and the second opening, and
wherein the first flexible material member or the second flexible material member is attached to the frame portion.

9. The electronic device of claim 8, wherein the frame portion forms a portion of an edge of the first hinge plate or the second hinge plate.

10. The electronic device of claim 8, wherein the first flexible material member or the second flexible material member is formed to surround the frame portion.

11. The electronic device of claim 8, further comprising:
fixing members disposed in respective one of the first opening or the second opening and including a first end and a second end fixed to the first hinge plate or the second hinge plate, respectively,
wherein the fixed portions of the flexible printed circuit board are mounted on one of the fixing members, respectively.

12. The electronic device of claim 11, wherein the first housing structure and the second housing structure rotate on the hinge structure between:
a first position where the first housing structure and the second housing structure are unfolded side-by-side; and
a second position where the first housing structure and the second housing structure are folded to face each other.

13. The electronic device of claim 12,
wherein the first flexible material member is disposed on the first hinge plate and the second flexible material member is disposed on the second hinge plate,
wherein in the first position, the first flexible material member and the second flexible material member are disposed adjacent to each other and side-by-side, and
wherein in the second position, the first flexible material member and the second flexible material member are disposed to face each other, with the first hinge plate and the second hinge plate disposed therebetween.

14. The electronic device of claim 13, wherein the first hinge plate or the second hinge plate includes a frame portion formed to surround or define at least a portion of the first opening or the second opening, and
wherein the first flexible material member or the second flexible material member is attached to the frame portion.

15. The electronic device of claim 14, wherein the first flexible material member or the second flexible material member includes: an attaching area formed on a surface facing the first hinge plate or the second hinge plate, and a non-attaching area formed in at least a portion of a circumference of the attaching area, on the surface facing the first hinge plate or the second hinge plate, and
wherein the attaching area is attached to at least a portion of the frame portion.

* * * * *